United States Patent
Im et al.

(10) Patent No.: US 11,612,066 B2
(45) Date of Patent: Mar. 21, 2023

(54) ELECTRONIC DEVICE INCLUDING METAL HOUSING

(71) Applicant: Samsung Electronics Co., Ltd., Suwon-si (KR)

(72) Inventors: Junghyun Im, Suwon-si (KR); Hyosang Lim, Suwon-si (KR); Heekwang Lim, Suwon-si (KR); Seungchang Baek, Suwon-si (KR); Hyeongsam Son, Suwon-si (KR); Sungho Cho, Suwon-si (KR); Hangyu Hwang, Suwon-si (KR); Jongchul Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 27 days.

(21) Appl. No.: 17/301,845

(22) Filed: Apr. 15, 2021

(65) Prior Publication Data
US 2021/0329799 A1 Oct. 21, 2021

(30) Foreign Application Priority Data
Apr. 17, 2020 (KR) .......................... 10-2020-0047045

(51) Int. Cl.
*H05K 5/02* (2006.01)
*H05K 5/00* (2006.01)

(52) U.S. Cl.
CPC ......... *H05K 5/0217* (2013.01); *H05K 5/0004* (2013.01); *H05K 5/0017* (2013.01)

(58) Field of Classification Search
CPC .......................... H05K 5/0217; H05K 5/0004
See application file for complete search history.

(56) References Cited

U.S. PATENT DOCUMENTS

| | | |
|---|---|---|
| 8,110,854 B2 | 2/2012 | Becker et al. |
| 8,129,750 B2 | 3/2012 | Becker et al. |

(Continued)

FOREIGN PATENT DOCUMENTS

| | | |
|---|---|---|
| KR | 10-2016-0031041 A | 3/2016 |
| KR | 10-2016-0099264 A | 8/2016 |
| WO | 2019093782 A1 | 5/2019 |

OTHER PUBLICATIONS

International Search Report dated Jul. 30, 2021 in connection with International Patent Application No. PCT/KR2021/004721, 4 pages.

*Primary Examiner* — Rockshana D Chowdhury
*Assistant Examiner* — Douglas R Burtner

(57) ABSTRACT

An electronic device includes a front plate, a back plate that faces away from the front plate, a display, a frame, a polymer member, and an adhesive layer. The display is disposed between the front plate and the back plate and visible through the front plate. The frame surrounds an interior space between the front plate and the back plate and formed of a metallic material. The frame includes a first metal part and a second metal part. The polymer member is coupled to the frame and contains a polymer material. The adhesive layer bonds the polymer member and the frame. The frame includes an opening formed in a first part thereof. The opening is formed through the first metal part and being formed to a specified depth through the second metal part. The polymer member forms at least part of an inner surface of the opening.

16 Claims, 15 Drawing Sheets

(56) References Cited

U.S. PATENT DOCUMENTS

| | | | | |
|---|---|---|---|---|
| 8,442,593 B1* | 5/2013 | Kwon | | H04M 1/0266 |
| | | | | 455/575.8 |
| 8,457,333 B2 | 6/2013 | Yeates et al. | | |
| 8,947,303 B2 | 2/2015 | Golko et al. | | |
| 9,634,378 B2 | 4/2017 | Golko et al. | | |
| 9,846,452 B2* | 12/2017 | Pakula | | H05K 7/14 |
| 10,148,000 B2 | 12/2018 | Hill et al. | | |
| 10,153,799 B2 | 12/2018 | Hwang et al. | | |
| 10,180,702 B2 | 1/2019 | Dabov et al. | | |
| 10,264,685 B2 | 4/2019 | Shi et al. | | |
| 10,432,768 B2 | 10/2019 | Choi et al. | | |
| 10,547,717 B2* | 1/2020 | Hill | | H04M 1/0249 |
| 10,559,872 B2 | 2/2020 | Hill et al. | | |
| 10,617,016 B2 | 4/2020 | Shi et al. | | |
| 10,768,664 B2 | 9/2020 | Cho et al. | | |
| 10,775,844 B2 | 9/2020 | Dabov et al. | | |
| 10,897,825 B2 | 1/2021 | Shi et al. | | |
| 11,036,255 B2 | 6/2021 | Cho et al. | | |
| 11,310,930 B2 | 4/2022 | Choi et al. | | |
| 2010/0061040 A1* | 3/2010 | Dabov | | H04M 1/026 |
| | | | | 361/679.01 |
| 2010/0061055 A1* | 3/2010 | Dabov | | H04M 1/026 |
| | | | | 381/334 |
| 2012/0157175 A1 | 6/2012 | Golko et al. | | |
| 2015/0214600 A1 | 7/2015 | Golko et al. | | |
| 2017/0069956 A1* | 3/2017 | Hill | | G06F 1/1656 |
| 2017/0094811 A1 | 3/2017 | Shi et al. | | |
| 2017/0111077 A1* | 4/2017 | Hwang | | H04M 1/18 |
| 2017/0318694 A1* | 11/2017 | Yun | | H04N 5/64 |
| 2018/0042146 A1* | 2/2018 | Murphy | | H05K 9/0007 |
| 2018/0070465 A1* | 3/2018 | Cater | | H04M 1/0249 |
| 2018/0160551 A1* | 6/2018 | Shi | | H01Q 1/42 |
| 2018/0192529 A1* | 7/2018 | Park | | H05K 5/0234 |
| 2018/0374871 A1 | 12/2018 | Becker et al. | | |
| 2019/0019810 A1 | 1/2019 | Becker et al. | | |
| 2019/0036201 A1 | 1/2019 | Hill et al. | | |
| 2019/0082555 A1* | 3/2019 | Hooton | | B41M 5/24 |
| 2019/0121391 A1 | 4/2019 | Dabov et al. | | |
| 2019/0222683 A1 | 7/2019 | Choi et al. | | |
| 2019/0317553 A1* | 10/2019 | Cho | | G06F 1/1605 |
| 2020/0035663 A1 | 1/2020 | Becker | | |
| 2020/0099129 A1* | 3/2020 | Suzuki | | G06F 1/1626 |
| 2020/0153088 A1 | 5/2020 | Hill et al. | | |
| 2020/0358890 A1* | 11/2020 | Im | | H05K 5/0217 |
| 2020/0379512 A1 | 12/2020 | Cho et al. | | |
| 2020/0384585 A1* | 12/2020 | Ren | | H04M 1/0249 |
| 2021/0055059 A1* | 2/2021 | Lee | | G06F 1/1626 |
| 2021/0341229 A1* | 11/2021 | Lee | | C09K 5/14 |
| 2022/0248548 A1* | 8/2022 | Zhong | | G06F 1/1641 |

* cited by examiner

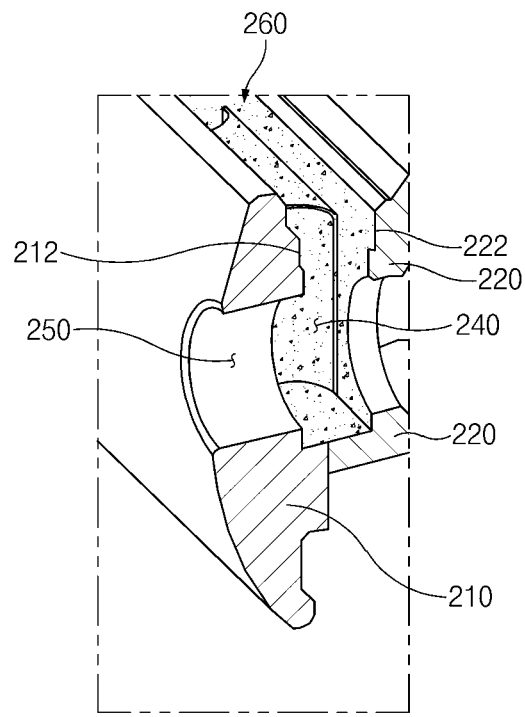
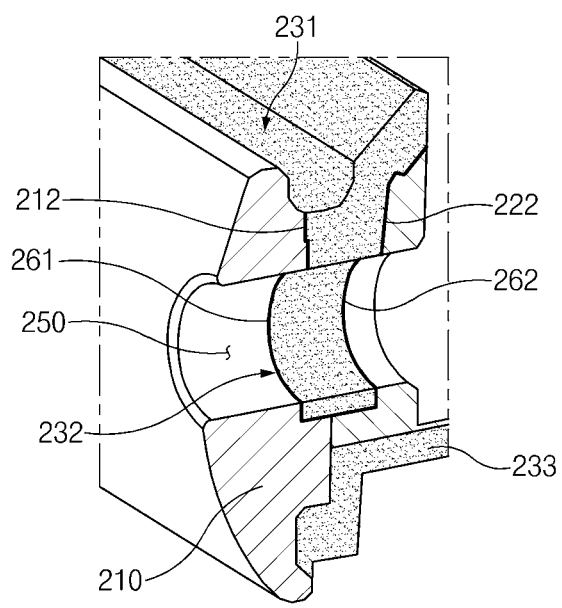
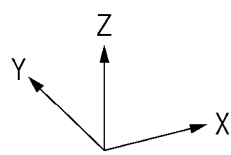
FIG.7A FIG.7B

ELECTRONIC DEVICE INCLUDING METAL HOUSING

CROSS-REFERENCE TO RELATED APPLICATION

This application is based on and claims priority under 35 U.S.C. § 119 to Korean Patent Application No. 10-2020-0047045, filed on Apr. 17, 2020, in the Korean Intellectual Property Office, the disclosure of which is incorporated by reference herein its entirety.

BACKGROUND

1. Field

The disclosure relates to an electronic device including a metal housing.

2. Description of Related Art

A housing of an electronic device may include a metal part formed of a metallic material and a polymer part coupled to the metal part. The metal part may include a first metal part, a second metal part, and contact surfaces by which the first metal part and the second metal part are coupled. The contact surfaces may include bumpy structures. The first metal part and the second metal part may be physically coupled through the bumpy structures.

The above information is presented as background information only to assist with an understanding of the disclosure. No determination has been made, and no assertion is made, as to whether any of the above might be applicable as prior art with regard to the disclosure.

SUMMARY

The first metal part and the second metal part may be physically coupled through the bumpy structures. The physical coupling cannot provide a sufficient coupling force. For example, in a process of manufacturing the housing, a clearance may be generated between the first metal part and the second metal part. The clearance may cause a defect in coloring.

Aspects of the disclosure are to address at least the above-mentioned problems and/or disadvantages and to provide at least the advantages described below. Accordingly, an aspect of the disclosure is to provide an electronic device including a metal housing in which a first metal part and a second metal part are at least partially chemically coupled with each other.

In accordance with an aspect of the disclosure, an electronic device includes a front plate, a back plate that faces away from the front plate, a display that is disposed between the front plate and the back plate and that is visible through the front plate, a frame that surrounds an interior space between the front plate and the back plate and that is formed of a metallic material, the frame including a first metal part containing a first metallic material and a second metal part containing a second metallic material, a polymer member that is coupled to the frame and that contains a polymer material, and an adhesive layer that bonds the polymer member and the frame. The frame has an opening formed in a first part thereof, the opening being formed through the first metal part and being formed to a specified depth through the second metal part, and the polymer member forms at least part of an inner surface of the opening.

In accordance with another aspect of the disclosure, an electronic device includes a housing including a front plate, a back plate that faces away from the front plate, and a side member that surrounds an interior space between the front plate and the back plate. A first part of the side member includes a first metal part that forms a surface of the electronic device and that contains a first metallic material, a second metal part that is coupled to the first metal part so as to extend in a direction from the first metal part toward the interior space and that contains a second metallic material, a polymer part that is coupled to the first metal part and the second metal part and that contains a polymer material, and a first adhesive layer that bonds the polymer part and the first metal part. A recess is concavely formed on the first metal part and the second metal part in a direction toward the front plate or the back plate, and the polymer part includes a first portion that forms an outer surface of the side member and that is formed on an area around the recess and a second portion that extends from the first portion into the recess.

In accordance with another aspect of the disclosure, an electronic device includes a front plate, a back plate that faces away from the front plate, a display that is disposed between the front plate and the back plate and that is visible through the front plate, a frame that surrounds an interior space between the front plate and the back plate, the frame including a first metal part containing a first metallic material and a second metal part containing a second metallic material, a polymer member that is coupled to the frame and that contains a polymer material, and an opening formed through the frame to connect the outside of the electronic device and the interior space, and an inner surface of the opening is formed by the first metal part.

Other aspects, advantages, and salient features of the disclosure will become apparent to those skilled in the art from the following detailed description, which, taken in conjunction with the annexed drawings, discloses various embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 7A and 7B illustrate sectional views of a portion of a side member of the electronic device according to an embodiment of this disclosure;

DETAILED DESCRIPTION

Figure 1:
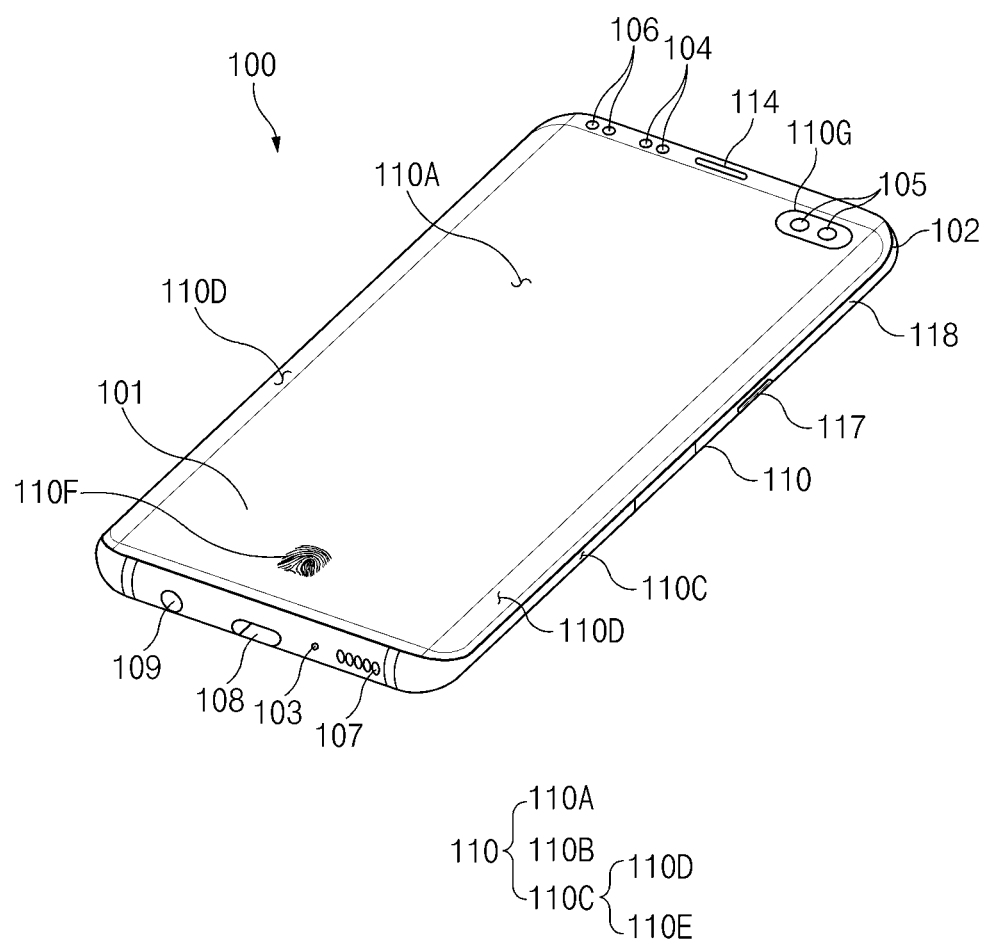
FIG. 1 illustrates a front perspective view of an electronic device according to an embodiment of this disclosure.
Figure 2:
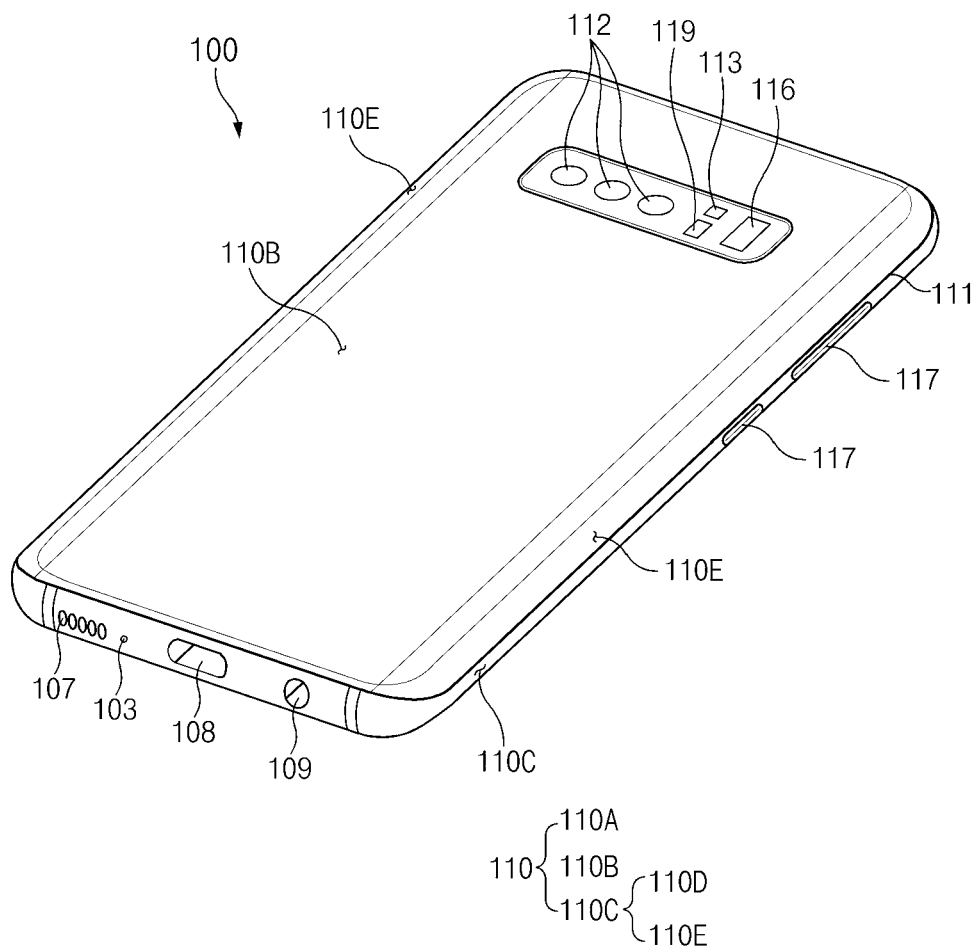
FIG. 2 illustrates a rear perspective view of the electronic device according to an embodiment of this disclosure.

FIGS. 1 through 12B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device:

FIG. 1 illustrates a front perspective view of an electronic device according to an embodiment of this disclosure. FIG. 2 illustrates a rear perspective view of the electronic device according to an embodiment of this disclosure.

Referring to FIGS. 1 and 2, the electronic device 100 according to an embodiment may include a housing 110 that includes a first surface (or, a front surface) 110A, a second surface (or, a rear surface) 110B, and side surfaces 110C surrounding a space between the first surface 110A and the second surface 110B.

In another embodiment (not illustrated), the housing 110 may refer to a structure that forms some of the first surface 110A, the second surface 110B, and the side surfaces 110C of FIG. 1.

According to an embodiment, the first surface 110A may be formed by a front plate 102, at least part of which is substantially transparent (e.g., a glass plate including various coating layers, or a polymer plate). The second surface 110B may be formed by a back plate 111 that is substantially opaque. The back plate 111 may be formed of, for example, coated or colored glass, ceramic, polymer, metal (e.g., aluminum, stainless steel (STS), or magnesium), or a combination of at least two of the aforementioned materials. The side surfaces 110C may be formed by a side bezel structure (or, a "frame structure") 118 that is coupled with the front plate 102 and the back plate 111 and that contains metal and/or polymer.

In some embodiments, the back plate 111 and the side bezel structure 118 may be integrally formed with each other and may contain the same material (e.g., a metallic material such as aluminum).

In the illustrated embodiment, the front plate 102 may include, at opposite long edges thereof, two first areas 110D that curvedly and seamlessly extend from the first surface 110A toward the back plate 111.

In the illustrated embodiment (refer to FIG. 2), the back plate 111 may include, at opposite long edges thereof, two second areas 110E that curvedly and seamlessly extend from the second surface 110B toward the front plate 102.

In some embodiments, the front plate 102 (or, the back plate 111) may include only one of the first areas 110D (or, the second areas 110E). In another embodiment, the front plate 102 (or, the back plate 111) may not include a part of the first areas 110D (or, the second areas 110E).

In the embodiments, when viewed from a side of the electronic device 100, the side bezel structure 118 may have a first thickness (or, width) at sides (e.g., short sides) not including the first areas 110D or the second areas 110E and may have a second thickness at sides (e.g., long sides) including the first areas 110D or the second areas 110E, the second thickness being smaller than the first thickness.

According to an embodiment, the electronic device 100 may include at least one of a display 101, audio modules 103, 107, and 114, sensor modules 104, 116, and 119, camera device 105, 112, and 113, key input devices 117, a light emitting element 106, or connector holes 108 and 109. In some embodiments, the electronic device 100 may not include at least one component (e.g., the key input devices 117 or the light emitting element 106) among the aforementioned components, or may additionally include other component(s).

The display 101, for example, may be exposed through most of the front plate 102. In some embodiments, at least part of the display 101 may be exposed through the front plate 102 that includes the first surface 110A and the first areas 110D of the side surfaces 110C.

In some embodiments, the periphery of the display 101 may be formed to be substantially the same as the shape of the adjacent outside edge of the front plate 102. In another embodiment (not illustrated), to expand the area by which the display 101 is exposed, the gap between the outside edge of the display 101 and the outside edge of the front plate 102 may be formed to be substantially constant.

In an embodiment, a surface of the housing 110 (or, the front plate 102) may include a screen display area that is formed as the display 101 is visually exposed. For example, the screen display area may include the first surface 110A and the first areas 110D of the side surfaces 110C.

In an embodiment, the screen display area 110A and 110D may include a sensing area 110F configured to obtain biometric information of a user. Here, when the screen display area 110A and 110D includes the sensing area 110F, this may mean that at least part of the sensing area 110F overlaps the screen display area 110A and 110D. For example, the sensing area 110F may refer to an area capable of displaying visual information of the display 101 like the other areas of the screen display area 110A and 110D and additionally obtaining the user's biometric information (e.g., fingerprint).

In an embodiment, the screen display area 110A and 110D of the display 101 may include an area 110G through which the first camera device 105 (e.g., a punch hole camera) is visually exposed. At least part of the periphery of the area 110G, through which the first camera device 105 is exposed, may be surrounded by the screen display area 110A and 110D. In various embodiments, the first camera device 105 may include a plurality of camera devices.

In another embodiment (not illustrated), the screen display area 110A and 110D of the display 101 may have a recess or an opening formed therein, and the electronic device 100 may include at least one of the audio module 114, the first sensor module 104, or the light emitting element 106 that is aligned with the recess or the opening.

In another embodiment (not illustrated), the display 101 may include, on a rear surface of the screen display area 110A and 110D, at least one of the audio module 114, the sensor modules 104, 116, and 119, or the light emitting element 106.

In another embodiment (not illustrated), the display 101 may be coupled with, or disposed adjacent to, touch detection circuitry, a pressure sensor for measuring the intensity (pressure) of a touch, and/or a digitizer for detecting a stylus pen of a magnetic type.

In some embodiments, at least a part of the sensor modules 104, 116, and 119 and/or at least a part of the key input devices 117 may be disposed on the side surfaces 110C (e.g., the first areas 110D and/or the second areas 110E).

The audio modules 103, 107, and 114 may include the microphone hole 103 and the speaker holes 107 and 114. A microphone for obtaining a sound from the outside may be disposed in the microphone hole 103, and in some embodiments, a plurality of microphones may be disposed in the microphone hole 103 to detect the direction of a sound. The speaker holes 107 and 114 may include the external speaker hole 107 and the receiver hole 114 for a telephone call. In some embodiments, the speaker holes 107 and 114 and the microphone hole 103 may be implemented with a single hole, or a speaker (e.g., a piezo speaker) may be included without the speaker holes 107 and 114.

The sensor modules 104, 116, and 119 may generate an electrical signal or a data value that corresponds to an operational state inside the electronic device 100 or an environmental state external to the electronic device 100. For example, the sensor modules 104, 116, and 119 may include the first sensor module 104 (e.g., a proximity sensor) that is disposed on the first surface 110A of the housing 110, the second sensor module 116 (e.g., a TOF camera device) that is disposed on the second surface 110B of the housing 110, the third sensor module 119 (e.g., an HRM sensor) that is disposed on the second surface 110B of the housing 110, and/or the fourth sensor module (e.g., a sensor 190 of FIG. 3) (e.g., a fingerprint sensor) that is coupled to the display 101.

In various embodiments, the second sensor module 116 may include a TOF camera device for measuring a distance.

In various embodiments, at least part of the fourth sensor module (e.g., the sensor 190 of FIG. 3) may be disposed under the screen display area 110A and 110D. For example, the fourth sensor module may be disposed in a recess (e.g., a recess 139 of FIG. 3) that is formed on a rear surface of the display 101. That is, the fourth sensor module (e.g., the sensor 190 of FIG. 3) may not be exposed through the screen display area 110A and 110D and may form the sensing area 110F in at least part of the screen display area 110A and 110D.

In some embodiments (not illustrated), the fingerprint sensor may be disposed on the second surface 110B as well as the first surface 110A of the housing 110 (e.g., the screen display area 110A and 110D).

In various embodiments, the electronic device 100 may further include a non-illustrated sensor module, which may be, for example, at least one of a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor.

The camera device 105, 112, and 113 may include the first camera device 105 (e.g., a punch hole camera device) exposed through the first surface 110A of the electronic device 100, and the second camera device 112 and/or the flash 113 exposed through the second surface 110B of the electronic device 100.

In the illustrated embodiment, the first camera device 105 may be exposed through a portion of the screen display area 110D of the first surface 110A. For example, the first camera device 105 may be exposed on a partial area of the screen display area 110D through an opening (not illustrated) that is formed in a portion of the display 101.

In the illustrated embodiment, the second camera device 112 may include a plurality of camera devices (e.g., a dual camera or a triple camera). However, the second camera device 112 is not necessarily limited to including the plurality of camera devices, and may include one camera device.

The camera devices 105 and 112 may include one or more lenses, an image sensor, and/or an image signal processor. The flash 113 may include, for example, a light emitting diode or a xenon lamp. In some embodiments, two or more lenses (an IR camera lens, a wide angle lens, and a telephoto lens) and image sensors may be disposed on one surface of the electronic device 100.

The key input devices 117 may be disposed on the side surfaces 110C of the housing 110. In another embodiment, the electronic device 100 may not include all or some of the aforementioned key input devices 117, and the key input devices 117 not included may be implemented in a different form, such as a soft key, on the display 101. In some embodiments, the key input devices may include a sensor module (e.g., the sensor 190 of FIG. 3) that forms the sensing area 110F included in the screen display area 110A and 110D.

The light emitting element 106, for example, may be disposed on the first surface 110A of the housing 110. The light emitting element 106, for example, may provide state information of the electronic device 100 in the form of light. In another embodiment, the light emitting element 106 may provide, for example, a light source that operates in conjunction with the first camera device 105. The light emitting element 106 may include, for example, an LED, an IR LED, and a xenon lamp.

The connector holes 108 and 109 may include the first connector hole 108 for accommodating a connector (e.g., a USB connector) for transmitting and receiving power and/or data with an external electronic device, and/or the second connector hole 109 (e.g., an earphone jack) for accommodating a connector for transmitting and receiving audio signals with an external electronic device.

Figure 3:
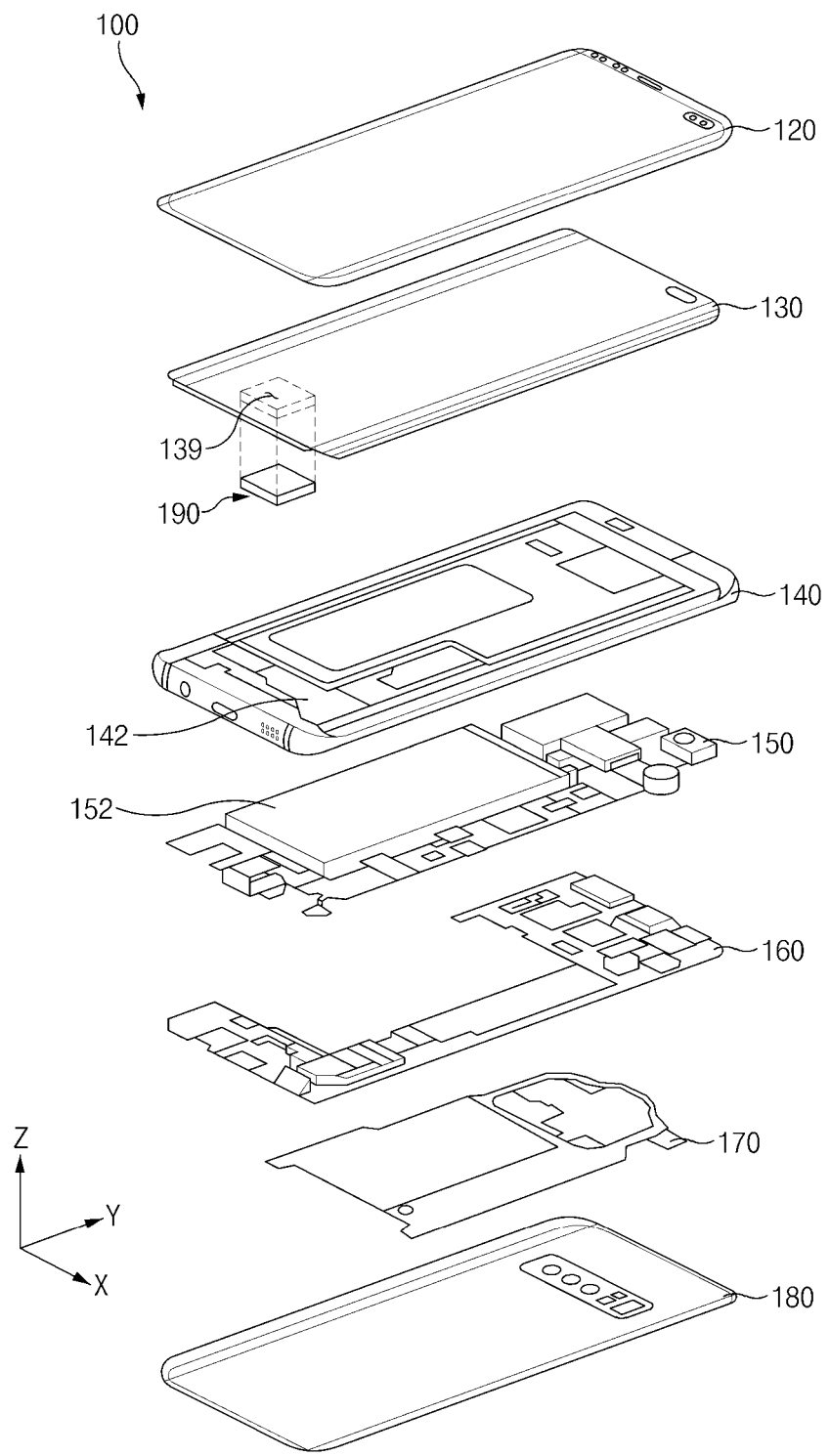
FIG. 3 illustrates an exploded perspective view of the electronic device according to an embodiment of this disclosure.

FIG. 3 illustrates an exploded perspective view of the electronic device according to an embodiment of this disclosure.

Referring to FIG. 3, the electronic device 100 may include a first cover 120 (e.g., the front surface 110A and the first areas 110D of FIG. 1, also referred to as the front plate or the first plate), a display 130 (e.g., the display 101 of FIG. 1), a bracket 140 (e.g., a part of the side surfaces 110C of FIG. 1), a first support member 142 (e.g., a plate structure), a printed circuit board 150, a battery 152, a mid-plate 160, an antenna 170, and a second cover 180 (e.g., the rear surface 110B and the second areas 110E of FIG. 1, also referred to as a back plate). In some embodiments, the electronic device 100 may not include at least one component (e.g., the first support member 142 or the mid-plate 160) among the aforementioned components, or may additionally include other component(s). At least one of the components of the electronic device 100 may be the same as, or similar to, at least one of the components of the electronic device 100 of FIG. 1 or FIG. 2, and repetitive descriptions will hereinafter be omitted.

The first support member 142 may be disposed in the electronic device 100 and may be connected with the bracket 140, or may be integrally formed with the bracket 140. The first support member 142 may be formed of, for example, a metallic material and/or a nonmetallic (e.g., polymer) material. The display 130 may be coupled to one surface of the first support member 142, and the printed circuit board 150 may be coupled to an opposite surface of the first support member 142. The printed circuit board 150 may have a processor, a memory, and/or an interface mounted thereon. The processor may include, for example, one or more of a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface, for example, may electrically or physically connect the electronic device 100 with an external electronic device and may include a USB connector, an SD card/MMC connector, or an audio connector.

The battery 152, which is a device for supplying electric power to at least one component of the electronic device 100, may include, for example, a primary cell that is not rechargeable, a secondary cell that is rechargeable, or a fuel cell. At least part of the battery 152, for example, may be disposed on substantially the same plane as the printed circuit board 150. The battery 152 may be integrally disposed inside the electronic device 100, or may be disposed so as to be detachable from the electronic device 100.

The antenna 170 may be disposed between the second cover 180 and the battery 152. The antenna 170 may include, for example, a near field communication (NFC) antenna, a wireless charging antenna, and/or a magnetic secure transmission (MST) antenna. The antenna 170, for example, may perform short-range communication with an external device, or may wirelessly transmit and receive electric power required for charging. In another embodiment, an antenna structure may be formed by the bracket 140 and/or a portion of the first support member 142, or a combination thereof.

Figure 4:
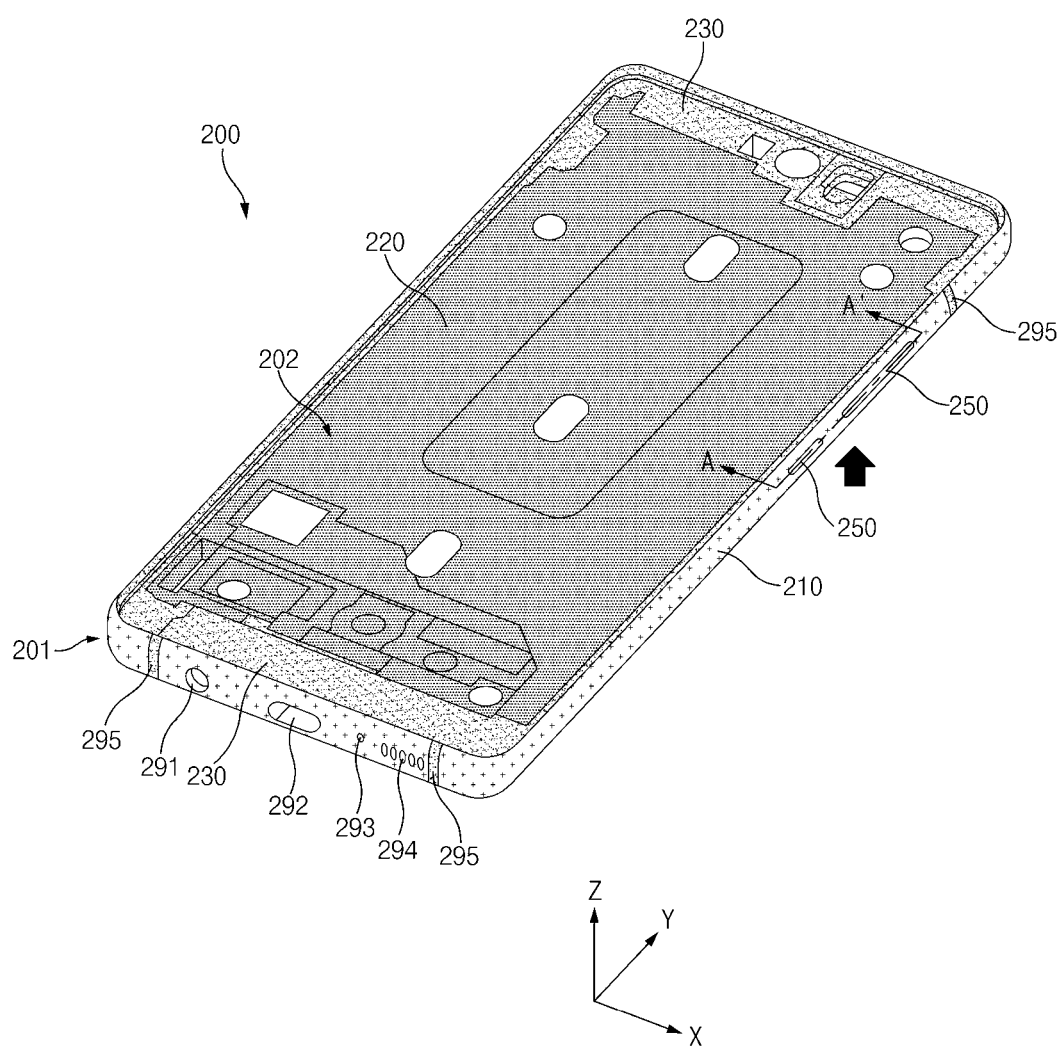
FIG. 4 illustrates a side member of the electronic device according to an embodiment of this disclosure.

FIG. 4 illustrates a view illustrating a side member of the electronic device according to an embodiment of this disclosure.

Referring to FIG. 4, in terms of structure, the side member 200 may include a plate structure 202 (e.g., the first support member 142 of FIG. 3) and a frame structure 201 surrounding the plate structure 202. In an embodiment, the frame structure 201 may form side surfaces (e.g., the side surfaces 110C of FIG. 1) of the electronic device 100. In an embodiment, the plate structure 202 and the frame structure 201 may be integrally formed with each other, or may be formed of separate members.

In an embodiment, the frame structure 201 may have openings 250 in which side keys (e.g., the key input devices 117 of FIG. 1) are accommodated, a second opening 291 into which an earphone jack is inserted, a third opening 292 into which a USB terminal is inserted, a microphone hole 293, and a speaker hole 294.

In an embodiment, the frame structure 201 may be formed by a first metal part 210 and a polymer part 230 (e.g., segmenting portions 295). In an embodiment, a printed circuit board (e.g., the printed circuit board 150 of FIG. 3) and/or a display (e.g., the display 130 of FIG. 3) may be disposed on the plate structure 202.

Referring to FIG. 4, the side member 200 may include the first metal part 210 formed of a first metallic material, a second metal part 220 formed of a second metallic material, and the polymer part 230 formed of a polymer material.

In an embodiment, the first metal part 210, together with the second metal part 220 and the polymer part 230, may form the frame structure 201. In an embodiment, the second metal part 220, together with the polymer part 230, may form the plate structure 202. In an embodiment, the first metal part 210 and the second metal part 220 may be physically or chemically coupled with each other. For example, the first metal part 210 and the second metal part 220 may be coupled directly or through the polymer part 230.

In an embodiment, the polymer part 230 may connect the frame structure 201 and the plate structure 202. For example, the polymer part 230 may physically couple the first metal part 210 and the second metal part 220. For example, adhesive layers may be formed on surfaces where the polymer part 230 and the metal parts 210 and 220 are coupled. For example, the adhesive layers may chemically couple the metal parts 210 and 220 and the polymer part 230.

In an embodiment, the polymer part 230 may form the segmenting portions 295, each of which electrically insulates a portion of the metal parts 210 and 220 included in the frame structure 201 from another portion. The metal portions insulated by the segmenting portions 295 may function as antennas of the electronic device 100.

In various embodiments, the polymer material contained in the polymer part 230 may include at least one of polyether ether ketone (PEEK), polyphenylene sulfide (PPS), polybutylene terephtalate (PBT), polyimide (PI), or polycarbonate (PC).

Figure 5A:
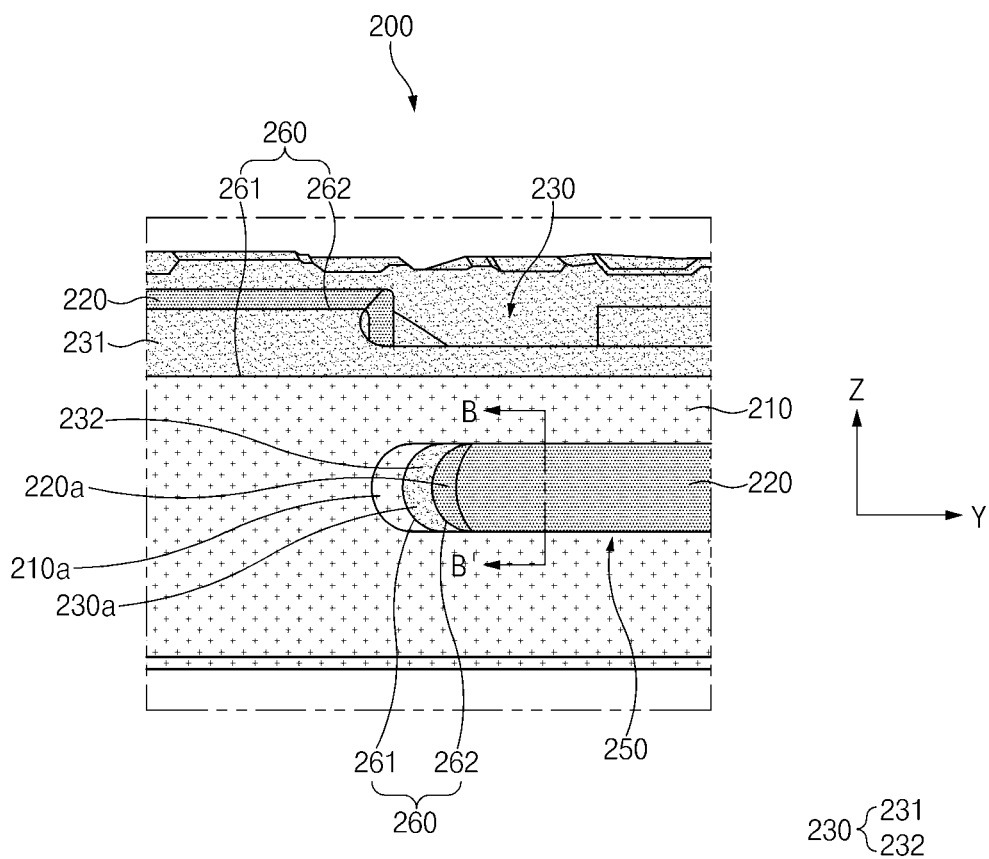
FIG. 5A illustrates the side member of the electronic device according to an embodiment of this disclosure.
Figure 5B:
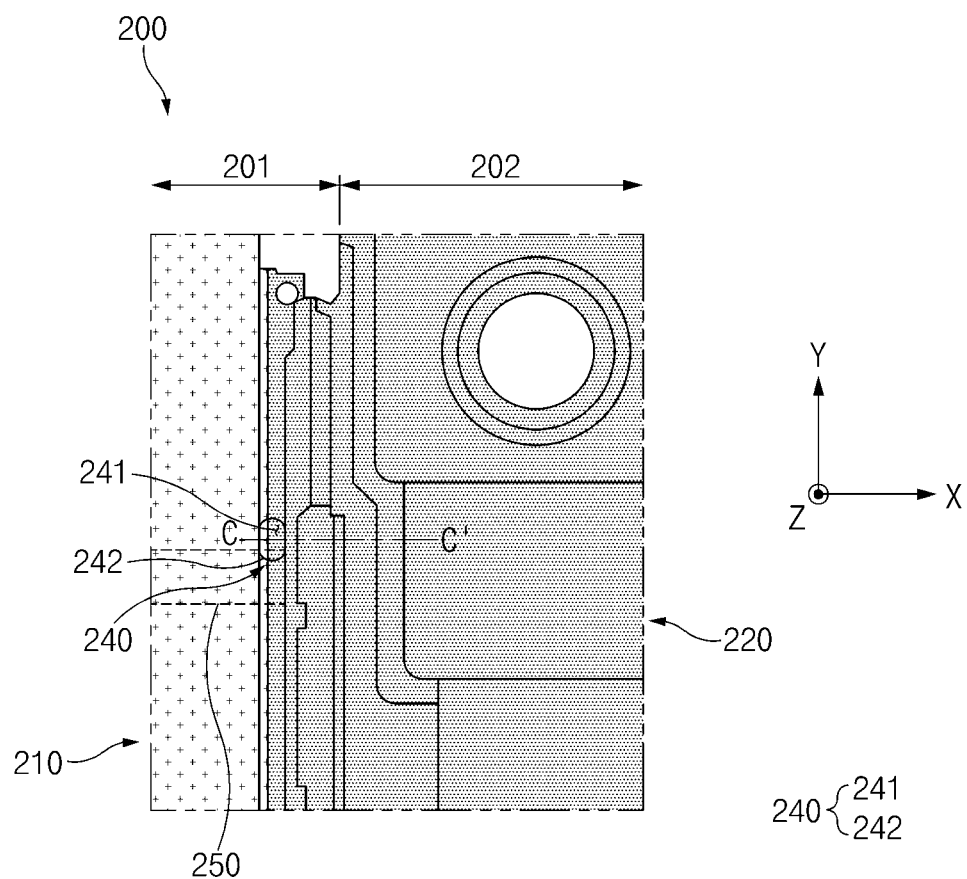
FIG. 5B illustrates a plan view of the side member of the electronic device according to an embodiment of this disclosure.

FIG. 5A illustrates the side member of the electronic device according to an embodiment of this disclosure. FIG. 5B illustrates a plan view of the side member of the electronic device according to an embodiment of this disclosure. FIG. 5A is a view of the side member as viewed in direction "A" illustrated in FIG. 4. FIG. 5B is a view of the side member as viewed in the Z-axis direction.

Referring to FIG. 5A, the side member 200 may have the opening 250 formed therein. The opening 250 may be formed through the first metal part 210. Additionally, the opening 250 may be formed through at least a portion of the second metal part 220.

In an embodiment, a first metal area 210a, a second metal area 220a, and a polymer area 230a may be formed on an inner surface of the opening 250. The first metal area 210a may include a portion of the first metal part 210. The second metal area 220a may include a portion of the second metal part 220. The polymer area 230a may include a portion of the polymer part 230.

In an embodiment, when the first metal area 210a and the second metal area 220a are viewed in the direction in which the opening 250 is formed through the first metal part 210 and the second metal part 220, the first metal area 210a may be formed adjacent to a surface of the side member 200 (e.g., the side surface 110C of the electronic device 100 of FIG. 1), and the second metal area 220a may be formed adjacent to an interior space of a housing (e.g., the housing 110 of FIG. 1). The polymer area 230a may be formed between the first metal area 210a and the second metal area 220a. For example, the second metal area 220a may be connected with a plate structure (e.g., the first support member 142 of FIG. 3 or the plate structure 202 of FIG. 4).

In an embodiment, a first adhesive layer 261 may be formed between the first metal area 210a and the polymer area 230a. A second adhesive layer 262 may be formed between the second metal area 220a and the polymer area 230a.

As illustrated in FIG. 5A, when the side member 200 is viewed from a side, the polymer part 230 may include a first portion 231 adjacent to an edge of the first metal part 210 and a second portion 232 visible through the opening 250. For example, as illustrated in FIG. 5B, when the side member 200 is viewed from above, the first portion 231 of the polymer part 230 may be coupled to the surface of the side member 200.

In an embodiment, the first portion 231 of the polymer part 230 may face the first cover 120 or the second cover 180. For example, the first portion 231 of the polymer part 230 may include an area on which a front plate (e.g., the first cover 120 of FIG. 3) or a back plate (e.g., the second cover 180 of FIG. 3) is seated. For example, the first portion 231 of the polymer part 230 may include an area on which a display (e.g., the display 130 of FIG. 3) is seated.

In an embodiment, an adhesive layer 260 may include the first adhesive layer 261 formed between the first metal part 210 and the polymer part 230 and the second adhesive layer 262 formed between the second metal part 220 and the polymer part 230. In an embodiment, the adhesive layer 260 may contain an organic material (e.g., carbon).

Although the side member 200 is illustrated as including both the first adhesive layer 261 and the second adhesive layer 262, the side member 200 is not necessarily limited thereto. For example, the side member 200 may include one of the first adhesive layer 261 and the second adhesive layer 262. For example, the side member 200 may include the first adhesive layer 261 for bonding the first metal part 210 and the polymer part 230 and may not include the second adhesive layer 262.

In an embodiment, the adhesive layer 260 may chemically couple the metal parts 210 and 220 and the polymer part 230. For example, the first adhesive layer 261 may contain the organic material, the polymer material, and the first metallic material. For example, the second adhesive layer 262 may contain the organic material, the polymer material, and the second metallic material. In various embodiments, an adhesive material contained in the adhesive layer 260 may be chemically bonded with the polymer material and the metallic materials.

In various embodiments, the adhesive layer 260 may include an organic adhesive layer containing at least one of triazine thiol, dithiopyrimidine, or a silane compound.

Referring to FIG. 5B, when the side member 200 is viewed from above, a portion of the surface of the side member 200 may be formed by the first metal part 210, and another portion of the surface of the side member 200 may be formed by the second metal part 220. In an embodiment, a recess 240 may be formed on the surface. For example, the recess 240 may be concavely formed on the surface in the—Z-axis direction. For example, the recess 240 may be formed on the frame structure 201. In an embodiment, the surface may include an area that faces the front plate (e.g., the first cover 120 of FIG. 3) or the back plate (e.g., the second cover 180 of FIG. 3).

In an embodiment, when the side member 200 is viewed from above (e.g., in the +Z-axis or—Z-axis direction), the first portion 231 of the polymer part 230 may be located on the surface to cover the recess 240. The second portion 232 of the polymer part 230 may extend from the first portion 231 and may be accommodated in the recess 240.

In an embodiment, at least part of the opening 250 may be formed through the second portion 232 of the polymer part 230 that is accommodated in the recess 240. For example, the opening 250 may be connected with a portion of the recess 240. For example, when the side member 200 is viewed from above, the recess 240 and the opening 250 may at least partially overlap each other.

In an embodiment, the recess 240 may be defined by the first metal part 210 and the second metal part 220. For example, a portion of a bottom surface 241 may be formed by the first metal part 210, and another portion of the bottom surface 241 may be formed by the second metal part 220. For example, a portion of a sidewall 242 may be formed by the first metal part 210, and another portion of the sidewall 242 may be formed by the second metal part 220. In various embodiments, the adhesive layer 260, which provides a chemical bond between the polymer material and the metallic materials, may be formed on the bottom surface 241 and the sidewall 242.

Figure 6A:
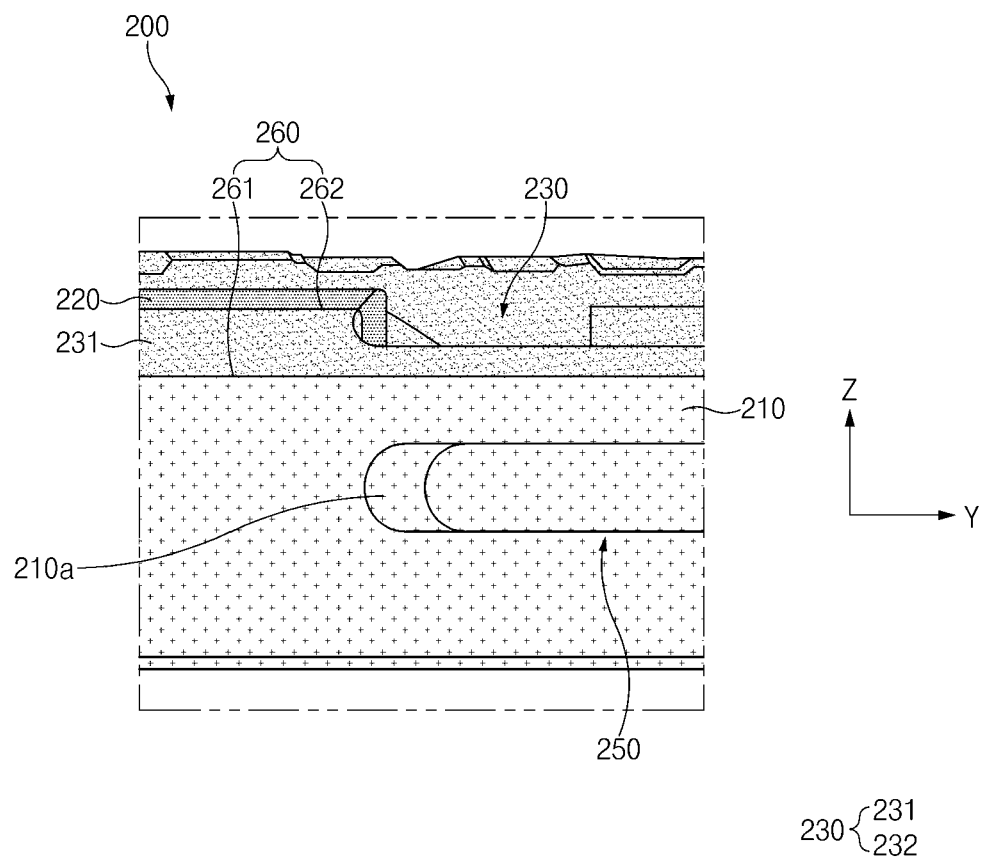
FIG. 6A illustrates a side member of the electronic device according to various embodiments of this disclosure.
Figure 6B:
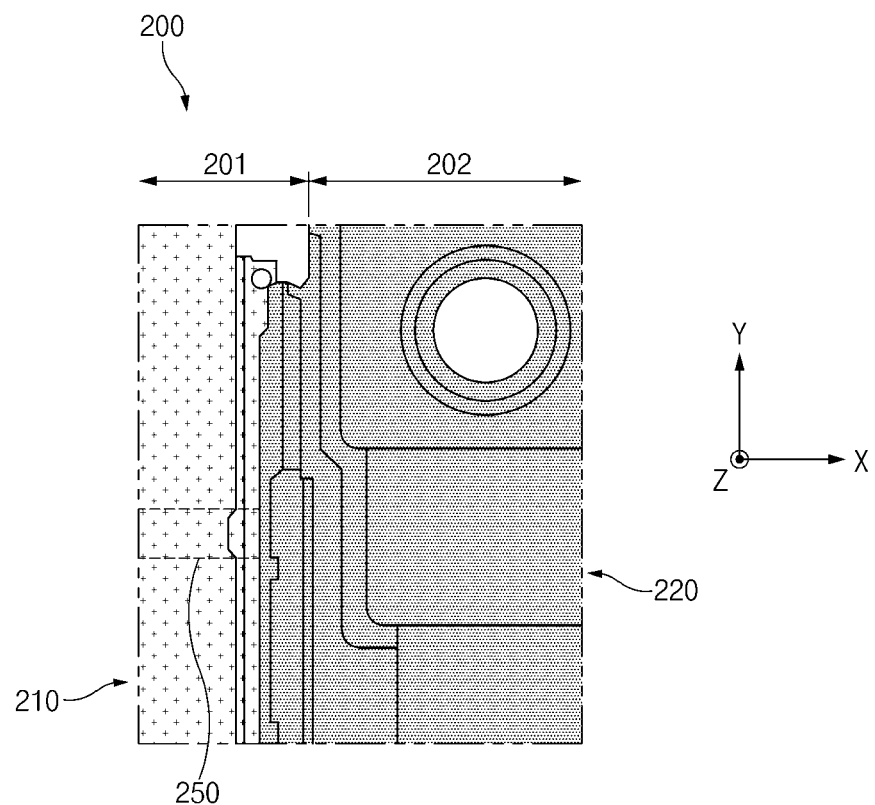
FIG. 6B illustrates a plan view of the side member of the electronic device according to various embodiments of this disclosure.

FIG. 6A illustrates a side member of the electronic device according to various embodiments of this disclosure. FIG. 6B illustrates is a plan view of the side member of the electronic device according to various embodiments of this disclosure. FIG. 6A is a view of the side member as viewed in direction "A" illustrated in FIG. 4. FIG. 6B is a view of the side member as viewed in the Z-axis direction.

Referring to FIG. 6A, the opening 250 may be formed in the side member 200. The opening 250 may be formed through the first metal part 210. Unlike the opening 250 of the side member 200 illustrated in FIGS. 5A and 5B, the opening 250 of the side member 200 illustrated in FIGS. 6A and 6B may not be formed through the second metal part 220.

In various embodiments, the first metal area 210a may be formed in the inner surface of the opening 250. The first metal area 210a may include a portion of the first metal part 210.

As illustrated in FIG. 6A, when the side member 200 is viewed from a side, the polymer part 230 may include the first portion 231 adjacent to the edge of the first metal part 210. For example, as illustrated in FIG. 6B, when the side member 200 is viewed from above, the first portion 231 of the polymer part 230 may be coupled to the surface of the side member 200.

In various embodiments, the first portion 231 of the polymer part 230 may face the first cover 120 or the second cover 180. For example, the first portion 231 of the polymer part 230 may include an area on which the front plate (e.g., the first cover 120 of FIG. 3) or the back plate (e.g., the second cover 180 of FIG. 3) is seated. For example, the first portion 231 of the polymer part 230 may include an area on which the display (e.g., the display 130 of FIG. 3) is seated.

In various embodiments, the adhesive layer 260 may include the first adhesive layer 261 formed between the first metal part 210 and the first portion 231 of the polymer part 230 and the second adhesive layer 262 formed between the second metal part 220 and the first portion 231 of the polymer part 230. In various embodiments, the adhesive layer 260 may contain an organic material (e.g., carbon).

Although the side member 200 is illustrated as including both the first adhesive layer 261 and the second adhesive layer 262, the side member 200 is not necessarily limited thereto. For example, the side member 200 may include one of the first adhesive layer 261 and the second adhesive layer 262. For example, the side member 200 may include the first adhesive layer 261 for bonding the first metal part 210 and the polymer part 230 and may not include the second adhesive layer 262.

In various embodiments, the adhesive layer 260 may chemically couple the metal parts 210 and 220 and the polymer part 230. For example, the first adhesive layer 261 may contain the organic material, the polymer material, and the first metallic material. For example, the second adhesive layer 262 may contain the organic material, the polymer material, and the second metallic material. In various embodiments, the adhesive material contained in the adhesive layer 260 may be chemically bonded with the polymer material and the metallic materials.

In various embodiments, the adhesive layer 260 may include an organic adhesive layer containing at least one of triazine thiol, dithiopyrimidine, or a silane compound.

Referring to FIG. 6B, when the side member 200 is viewed from above, a portion of the surface of the side member 200 may be formed by the first metal part 210, and another portion of the surface of the side member 200 may be formed by the second metal part 220. For example, the first metal part 210 may form the frame structure 201 of the side member 200, and the second metal part 220 may form the plate structure 202 of the side member 200. For example, the opening 250 may be formed through the first metal part 210.

A portion of the side member 200 illustrated in FIGS. 5A to 9 may refer to a portion around the opening 250 as a portion of the frame structure 201 of the side member 200.

For example, other portions (e.g., portions where the opening 250 is not formed) of the side member 200 may be configured such that the first metal part 210 forms outside surfaces of the frame structure 201 (e.g., the side surfaces 110C of the electronic device 100 of FIG. 1) and the second metal part 220 forms inside surfaces of the frame structure 201.

According to the embodiment illustrated in FIGS. 5A and 5B, a first part of the side member 200 may include the first metal part 210, the polymer part 230, the adhesive layer 260, and the second metal part 220. As described above, the adhesive layer 260 may include at least one of the first adhesive layer 261 or the second adhesive layer 262.

According to the embodiment illustrated in FIGS. 6A and 6B, the first part of the side member 200 may include the first metal part 210.

FIGS. 7A and 7B illustrate sectional views of a portion of a side member of the electronic device according to an embodiment of this disclosure. FIGS. 7A and 7B is a sectional view taken along line C-C' illustrated in FIG. 5B or a sectional view taken along line B-B' illustrated in FIG. 5A.

FIG. 7A is a view illustrating the portion of the side member 200. For example, the portion of the side member 200 illustrated in FIG. 7A does not include the polymer portions 231 and 232 in the side member 200 illustrated in FIG. 7B.

Referring to FIG. 7A, the first metal part 210 may include a first inner surface 212 facing the second metal part 220. The second metal part 220 may include a second inner surface 222 facing the first metal part 210. The first inner surface 212 and the second inner surface 222 may face each other. For example, the first inner surface 212 and the second inner surface 222 may face each other in the direction (e.g., the X-axis direction) in which the opening 250 is formed through the first metal part 210.

In an embodiment, the adhesive layer 260 may be formed on the first metal part 210 and the second metal part 220. For example, the adhesive layer 260 may be formed by applying an adhesive material to the first metal part 210 and the second metal part 220. For example, the adhesive layer 260 may be formed on the first inner surface 212 and the second inner surface 222. For example, the adhesive layer 260 may be formed in the recess 240. In an embodiment, the adhesive layer 260 may be formed on the area where the polymer part 230 is disposed.

Referring to FIG. 7B, the polymer part 230 may include the second portion 232 accommodated in the recess 240 and the first portion 231 extending from the second portion 232 to an area around the recess 240. In an embodiment, the first portion 231 of the polymer part 230 may be coupled to partial areas of surfaces of the first metal part 210 and the second metal part 220. For example, the first portion 231 of the polymer part 230 may be coupled to the first metal part 210 and the second metal part 220 by the adhesive layer 260 applied to the area around the recess 240. In an embodiment, the polymer part 230 may be formed between the first inner surface 212 and the second inner surface 222. In an embodiment, the first adhesive layer 261 may be formed between the first inner surface 212 and the polymer part 230. In an embodiment, the second adhesive layer 262 may be formed between the second inner surface 222 and the polymer part 230.

In various embodiments, at least a portion of the first metal part 210 and at least a portion of the second metal part 220 may be coupled with the polymer part 230 through the adhesive layer 260, and another portion of the first metal part 210 and another portion of the second metal part 220 may be directly coupled with the polymer part 230 by direct contact of the first inner surface 212 and the second inner surface 222 with the polymer part 230.

Referring to FIG. 7B, the polymer part 230 may further include a third portion 233. The third portion 233 may be formed on areas of the first metal part 210 and the second metal part 220 that face the front plate (e.g., the first cover 120 of FIG. 3) or the back plate (e.g., the second cover 180 of FIG. 3). For example, the first portion 231 may include a portion located in the +Z-axis direction with respect to the opening 250, and the third portion 233 may include a portion located in the—Z-axis direction with respect to the opening 250. In an embodiment, the first portion 231 may face one of the front plate or the back plate. In an embodiment, the third portion 233 may face the other one of the front plate or the back plate.

Referring to FIG. 7B, the first metal part 210, the first adhesive layer 261, the polymer part 230, the second adhesive layer 262, and the second metal part 220 may be sequentially disposed on the inner surface of the opening 250 when viewed in the direction in which the opening 250 is formed through the first metal part 210.

In various embodiments, the first metal part 210, the first adhesive layer 261, the polymer part 230, and the second metal part 220 may be sequentially disposed on the inner surface of the opening 250 when viewed in the direction in which the opening 250 is formed through the first metal part 210. For example, the second adhesive layer 262 may not be disposed on the inner surface of the opening 250 illustrated in FIG. 7B.

Figure 8A:
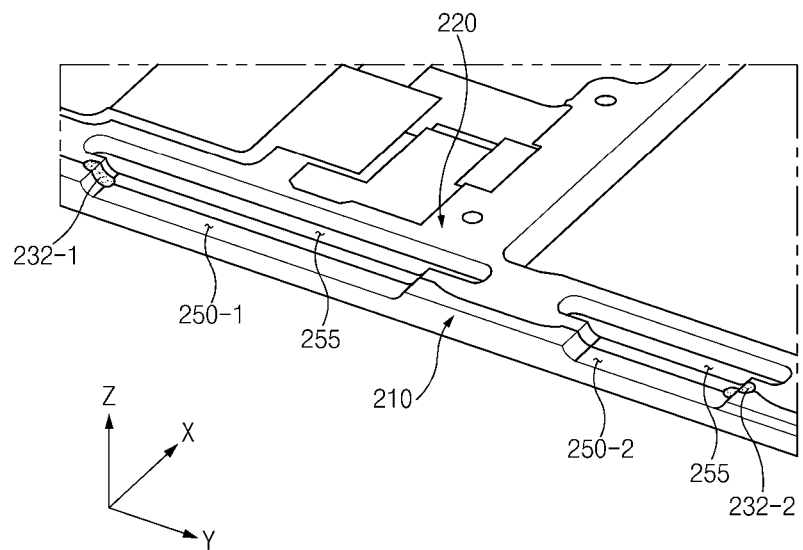
FIGS. 8A and 8B illustrate sectional views of a side member of the electronic device according to an embodiment of this disclosure.
Figure 8B:
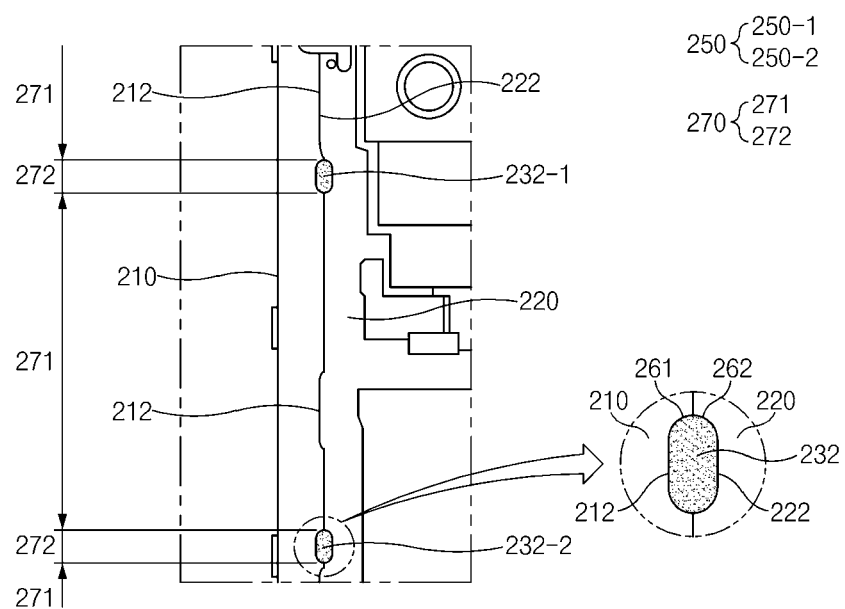

FIGS. 8A and 8B illustrate sectional views of a side member of the electronic device according to an embodiment of this disclosure. FIGS. 8A and 8B are views illustrating a section obtained by cutting the side member with a virtual plane passing through openings. For example, FIGS. 8A and 8B are a sectional view taken along line A-A' of FIG. 4.

In an embodiment, the side member 200 may include one or more openings 250. For example, the openings 250 may include a first opening 250-1 and a second opening 250-2 formed in a position spaced apart from the first opening 250-1 in the Y-axis direction. For example, the first opening 250-1 and the second opening 250-2 may be formed in a shape that extends along the Y-axis direction. For example, the openings 250-1 and 250-2 may extend along the lengthwise direction of a frame structure (e.g., the frame structure 201 of FIG. 4).

In an embodiment, the openings 250-1 and 250-2 of the side member 200 may be formed through the first metal part 210 and a portion of the second metal part 220. In an embodiment, the side member 200 may include spaces 255 that are connected with the openings 250-1 and 250-2 and in which side key structures (e.g., the key input devices 117 of FIG. 1) of the electronic device 100 are disposed.

In an embodiment, the second portion 232 of the polymer part 230 may be formed on areas around the openings 250-1 and 250-2. For example, portion 2-1 232-1 may be formed adjacent to a first end portion (e.g., an end portion facing the—Y-axis direction) of the first opening 250-1. Portion 2-2 232-2 may be formed adjacent to a second end portion (e.g., an end portion facing the Y-axis direction) of the second opening 250-2. However, the position of the second portion 232 of the polymer part 230 is not limited to that illustrated in FIGS. 8A and 8B. For example, the second portion 232 of the polymer part 230 may be formed adjacent to at least one of opposite longitudinal end portions of the first opening 250-1 and opposite longitudinal end portions of the second opening 250-2.

In an embodiment, the second portion 232 of the polymer part 230 may be surrounded by the first metal part 210 and the second metal part 220. The first metal part 210 may be coupled to the polymer part 230 through the first adhesive layer 261, and the second metal part 220 may be coupled to the polymer part 230 through the second adhesive layer 262.

In various embodiments, the side member 200 may include a coupling structure that provides a coupling force to the first metal part 210 and the second metal part 220.

For example, the coupling structure may include a first coupling area 271 in which the first inner surface 212 and the second inner surface 222 are directly coupled with each other and a second coupling area 272 in which the first inner surface 212 and the second inner surface 222 are coupled with the polymer part 230 through the adhesive layers 261 and 262.

For example, the first coupling area 271 may include the first metal part 210, the second metal part 220, and bumpy structures formed on the first inner surface 212 and the second inner surface 222. The first coupling area 271 may be coupled by a frictional force between the bumpy structure of the first inner surface 212 and the bumpy structure of the second inner surface 222. In various embodiments, the bumpy structures may be formed by laser machining.

For example, the second coupling area 272 may include the first metal part 210, the second metal part 220, the first adhesive layer 261, the second portion 232 of the polymer part 230, and the second adhesive layer 262. For example, the second coupling area 272 may be formed in a position adjacent to the second portion 232 of the polymer part 230. For example, referring to FIG. 8B, the second coupling area 272 may be formed adjacent to end portions of the openings 250-1 and 250-2 in the extension direction.

In various embodiments, the second coupling area 272 may include the first adhesive layer 261 and the second adhesive layer 262. For example, an adhesive material may be chemically bonded with metal atoms and polymer molecules to provide a coupling force stronger than that in the first coupling area 271.

Although the second coupling area 272 is illustrated as including both the first adhesive layer 261 and the second adhesive layer 262, the second coupling area 272 is not necessarily limited thereto. For example, the second coupling area 272 may include one of the first adhesive layer 261 and the second adhesive layer 262. For example, the second coupling area 272 may include the first adhesive layer 261 for bonding the first metal part 210 and the polymer part 230 and may not include the second adhesive layer 262.

Figure 9A:
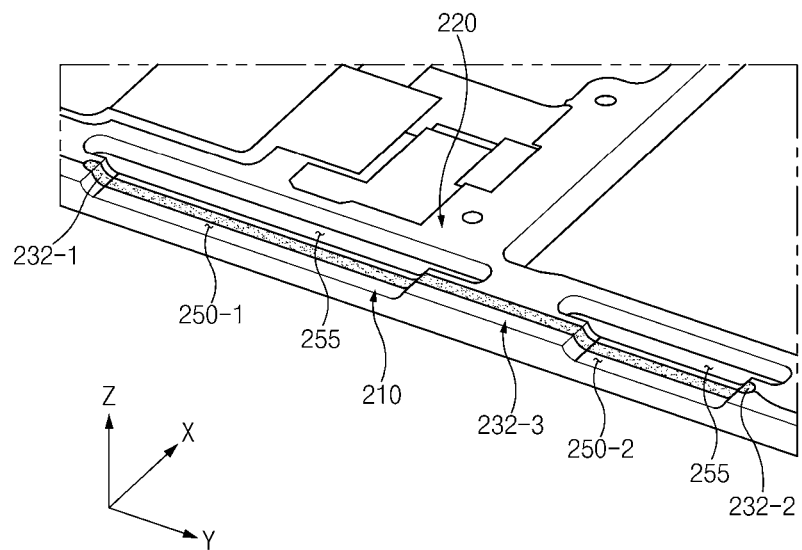
FIGS. 9A and 9B illustrate sectional view of a side member of the electronic device according to another embodiment of this disclosure.
Figure 9B:
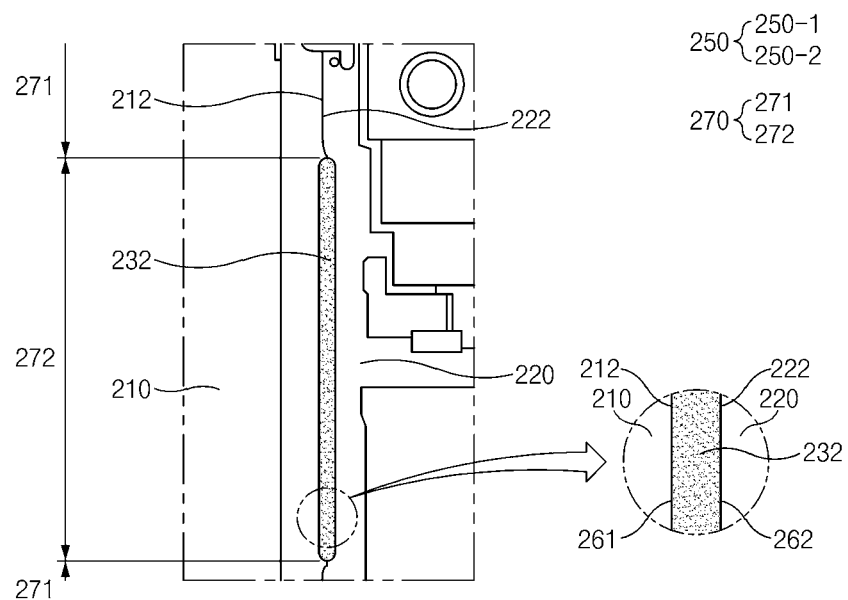

FIGS. 9A and 9B illustrate a sectional view of a side member of the electronic device according to another embodiment of this disclosure. FIGS. 9A and 9B are views illustrating a section obtained by cutting the side member with a virtual plane passing through openings. For example, FIGS. 9A and 9B are sectional views taken along line A-A' of FIG. 4.

In an embodiment, the second portion 232 of the polymer part 230 may be formed on areas around the openings 250-1 and 250-2. For example, the second portion 232 of the polymer part 230 may include portion 2-1 232-1 formed adjacent to the first end portion (e.g., the end portion facing the—Y-axis direction) of the first opening 250-1, portion 2-2 232-2 formed adjacent to the second end portion (e.g., the end portion facing the Y-axis direction) of the second opening 250-2, and portion 2-3 232-3 extending from portion 2-1 232-1 to portion 2-2 232-2. In various embodiments, portion 2-1 232-1, portion 2-2 232-2, and portion 2-3 232-3 may extend along the peripheries of an inner surface of the first opening 250-1 and an inner surface of the second opening 250-2. However, the position of the second portion 232 of the polymer part 230 is not limited to that illustrated in FIGS. 9A and 9B.

In various embodiments, as the area of the second coupling area 272 is increased, the coupling force of the first metal part 210 and the second metal part 220 may be increased. For example, the side member 200 according to the embodiment illustrated in FIGS. 9A and 9B may provide a strong coupling force between the first metal part 210 and the second metal part 220, compared to the side member 200 according to the embodiment illustrated in FIGS. 8A and 9B.

Although the second coupling area 272 is illustrated as including both the first adhesive layer 261 and the second adhesive layer 262, the second coupling area 272 is not necessarily limited thereto. For example, the second coupling area 272 may include one of the first adhesive layer 261 and the second adhesive layer 262. For example, the second coupling area 272 may include the first adhesive layer 261 for bonding the first metal part 210 and the polymer part 230 and may not include the second adhesive layer 262.

Figure 10:
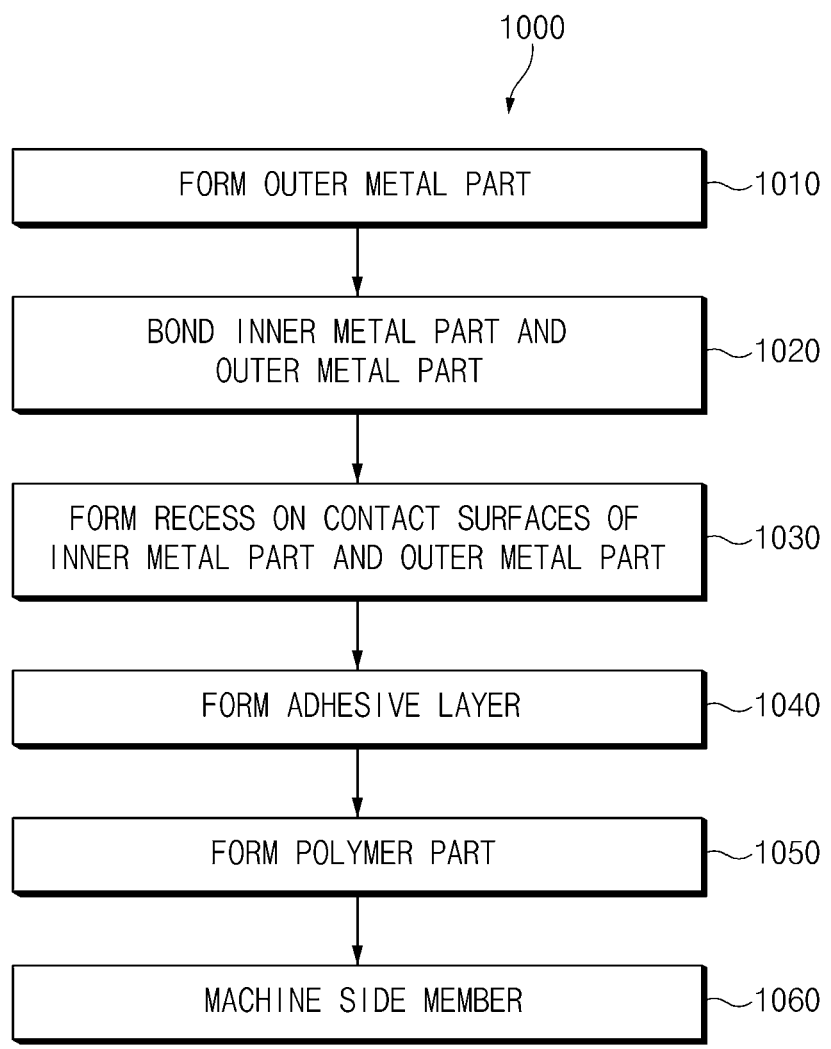
FIG. 10 illustrates a method for manufacturing a side member of an electronic device according to an embodiment of this disclosure.

FIG. 10 illustrates a method for manufacturing a side member of an electronic device according to an embodiment of this disclosure.

Referring to FIG. 10, the method 1000 for manufacturing the side member (e.g., the side member 200 of FIG. 4) may include an operation 1010 of forming an outer metal part (e.g., the first metal part 210 of FIGS. 8A and 8B), an operation 1020 of coupling an inner metal part (e.g., the second metal part 220 of FIGS. 8A and 8B) and the outer metal part, an operation 1030 of forming a recess (e.g., the recess 240 of FIGS. 7A and 8B) on contact surfaces (e.g., the first coupling area 271 of FIGS. 8A and 8B), an operation 1040 of forming adhesive layers (e.g., the adhesive layer 260 of FIGS. 7A and 8B) on the outer metal part and the inner metal part, an operation 1050 of forming a polymer part (e.g., the second portion 232 of FIGS. 8A and 8B), and an operation 1050 of machining the side member.

In an embodiment, the operation 1010 of forming the outer metal part may include an operation of bending rod-shaped metal base materials (e.g., first metal base materials 1111 of FIGS. 11A-11E).

In an embodiment, the operation 1020 of coupling the inner metal part and the outer metal part may include an operation of forming bumpy structures on the contact surfaces of the outer metal part and the inner metal part through a laser. The bumpy structures may increase a frictional force between the inner metal part and the outer metal part to provide a physical coupling force. In various embodiments, the inner metal part may be formed by die casting.

In an embodiment, in the operation 1030 of forming the recess on the contact surfaces, the recess may be formed on surfaces of the outer metal part and the inner metal part. The recess may include a space surrounded by the outer metal part and the inner metal part.

In an embodiment, in the operation 1040 of forming the adhesive layers, an adhesive material may be applied to the outer metal part and the inner metal part. For example, the adhesive material may be applied to the inside of the recess.

For example, the operation 1040 of forming the adhesive layers may be performed by immersing the outer metal part and the inner metal part in the adhesive material received in a container. The adhesive material may include an organic material.

In an embodiment, the operation 1050 of forming the polymer part may be performed by injecting a polymer material into a cavity (e.g., a cavity 1211 of FIG. 12B) of a mold. For example, the outer metal part and the inner metal part may be located in the mold. The cavity may include a space between the injection mold and the inner and outer metal parts. For example, the cavity may include the recess. In the operation 1050 of forming the polymer part, the polymer material may be received in the recess.

In an embodiment, in the operation 1060 of machining the side member, openings (e.g., the opening 250-1 and 250-2 of FIGS. 8A and 8B) may be formed through the outer metal part, the inner metal part, and the injection-molded part. Furthermore, the side member may be machined such that the outer metal part forms a surface (e.g., the frame structure 201 of FIG. 4) of the side member and the inner metal part forms a plate structure (e.g., the plate structure 202 of FIG. 4).

In various embodiments, the method 1000 for manufacturing the side member may further include coloring the outer metal part and the inner metal part before the operation 1060 of machining the side member after the operation 1050 of forming the polymer part.

FIGS. 11A-11E is a view illustrating a method for manufacturing a side member of an electronic device according to an embodiment.

Figure 11A:
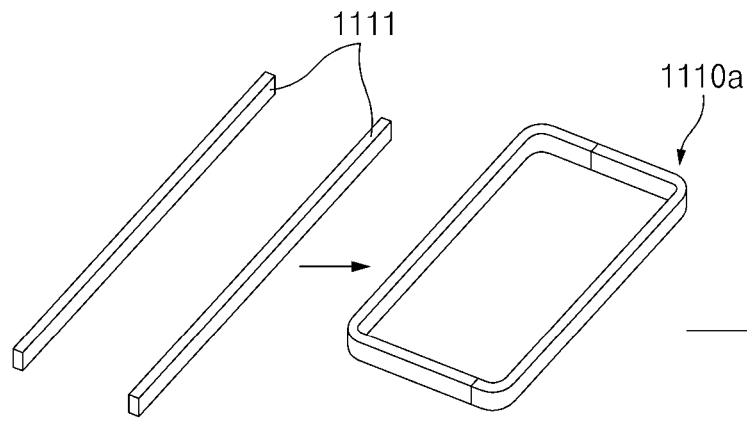
FIGS. 11A-11E illustrate a method for manufacturing a side member of an electronic device according to an embodiment of this disclosure.
Figure 11B:
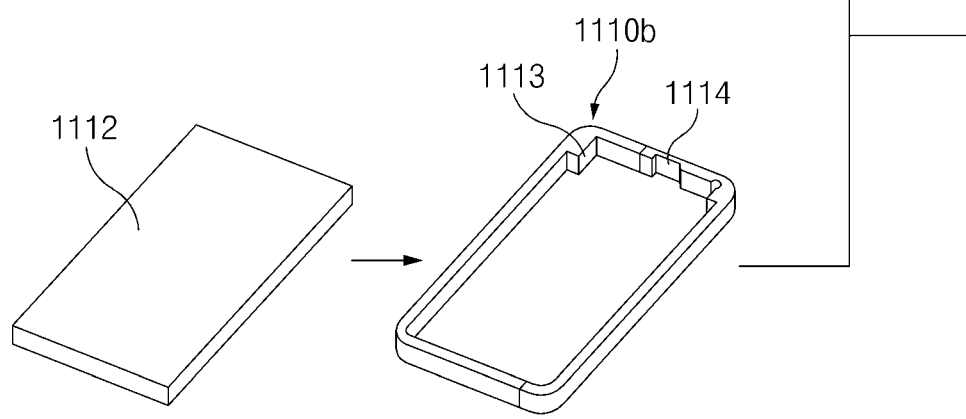

Referring to FIGS. 11A and 11B, an outer metal part 1110a or 1110b may be formed by machining the first metal base materials 1111 having a rod shape or a first metal base material 1112 having a plate shape. For example, the outer metal part 1110a or 1110b may be formed in a frame shape. Referring to FIG. 11A, the outer metal part 1110a may be formed by bending the rod-shaped first metal base materials 1111 extending in the lengthwise direction. Referring to FIG. 11B, the outer metal part 1110b of the side member may be formed by removing a central portion from the first metal base material 1112 having a flat plate shape. For example, the central portion may be cut away from the first metal base material 1112 through CNC machining, and peripheral portions may form the outer metal part 1110b.

In various embodiments, the outer metal part 1110a of FIG. 11A may have a substantially uniform thickness.

In various embodiments, the outer metal part 1110b of FIG. 11B may have different thicknesses. For example, the outer metal part 1110b may include a relatively thin portion 1114 and a relatively thick portion 1113. The positions of the thin portion 1114 and the thick portion 1113 are not limited to those illustrated in FIG. 11B.

In various embodiments, the outer metal part 1110b manufactured according to FIG. 11B may form the frame structure of the side member 200 illustrated in FIGS. 6A and 6B. For example, when the opening 250 is formed in the relatively thick portion 1113, the inner surface of the opening 250 may be formed by only a first metal part (e.g., the first metal part 210 of FIG. 6A) as illustrated in FIGS. 6A and 6B.

Figures 11C, 11D, 11E:
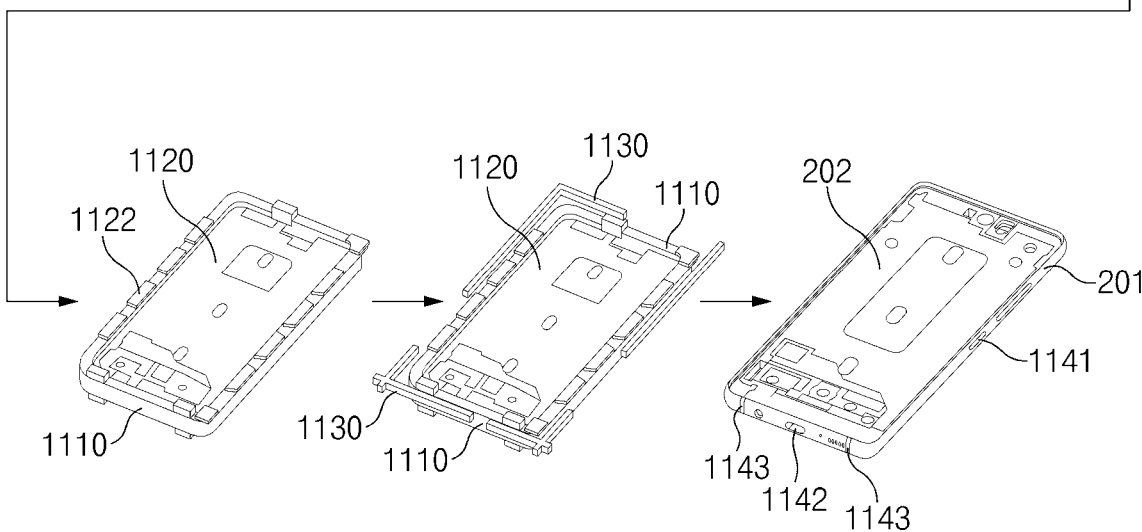

Referring to FIG. 11C, an inner metal part 1120 having a plate shape may be coupled to an outer metal part 1110 having a frame shape. The inner metal part 1120 may include one or more bridges 1122 connected to the outer metal part 1110. As described above, bumpy structures may be formed on contact surfaces of the outer metal part 1110 and the inner metal part 1120 through laser machining. In various embodiments, the inner metal part 1120 may be formed through a die casting process.

Referring to FIG. 11D, a polymer part 1130 may be coupled to the outer metal part 1110 and the inner metal part 1120. The polymer part 1130 may be coupled to the outer metal part 1110 and the inner metal part 1120 by adhesive layers (e.g., the adhesive layer 260 of FIGS. 7A and 7B) that are applied to surfaces of the outer metal part 1110 and the inner metal part 1120. In various embodiments, a recess (e.g., the recess 240 of FIGS. 7A and 7B) may be formed on the outer metal part 1110 and the inner metal part 1120. The adhesive layers may be formed on an inner surface of the recess. A polymer material may be received in the recess. Accordingly, the coupling force between a first inner surface (e.g., the first inner surface 212 of FIGS. 8A and 8B) of the outer metal part 1110 and a second inner surface (e.g., the second inner surface 222 of FIGS. 8A and 8B) of the inner metal part 1120 may be increased.

Referring to FIG. 11E, the side member may be formed by machining the structure illustrated in FIG. 11D. For example, the structure illustrated in FIG. 11D may be machined such that the outer metal part 1110 forms the frame structure 201 of the side member 200, the inner metal part 1120 forms the plate structure 202 of the side member 200, and the polymer part 1130 connects the outer metal part 1110 and the inner metal part 1120. For example, portions (e.g., segmenting portions 1143 or the segmenting portions 295 of FIG. 4) of the polymer part 1130, together with the outer metal part 1110, may form the frame structure 201. For example, the side member 200 may have one or more openings 1141 and 1142 (e.g., the opening 250 of FIGS. 7A and 7B) that are formed through at least one of the outer metal part 1110, the inner metal part 1120, or the polymer part 1130.

Figure 12A:
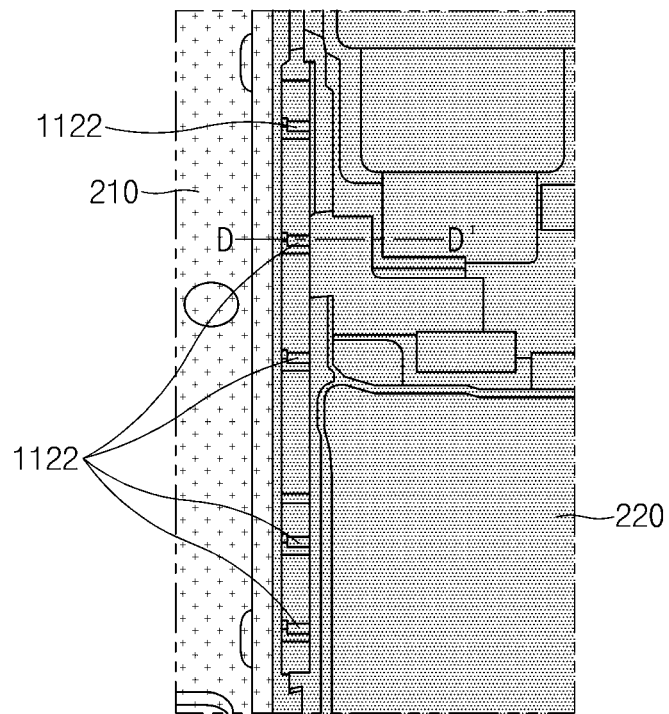
FIG. 12A illustrates a view related to an operation of bonding an inner metal part and an outer metal part of FIG. 10 according to an embodiment of this disclosure.
Figure 12B:
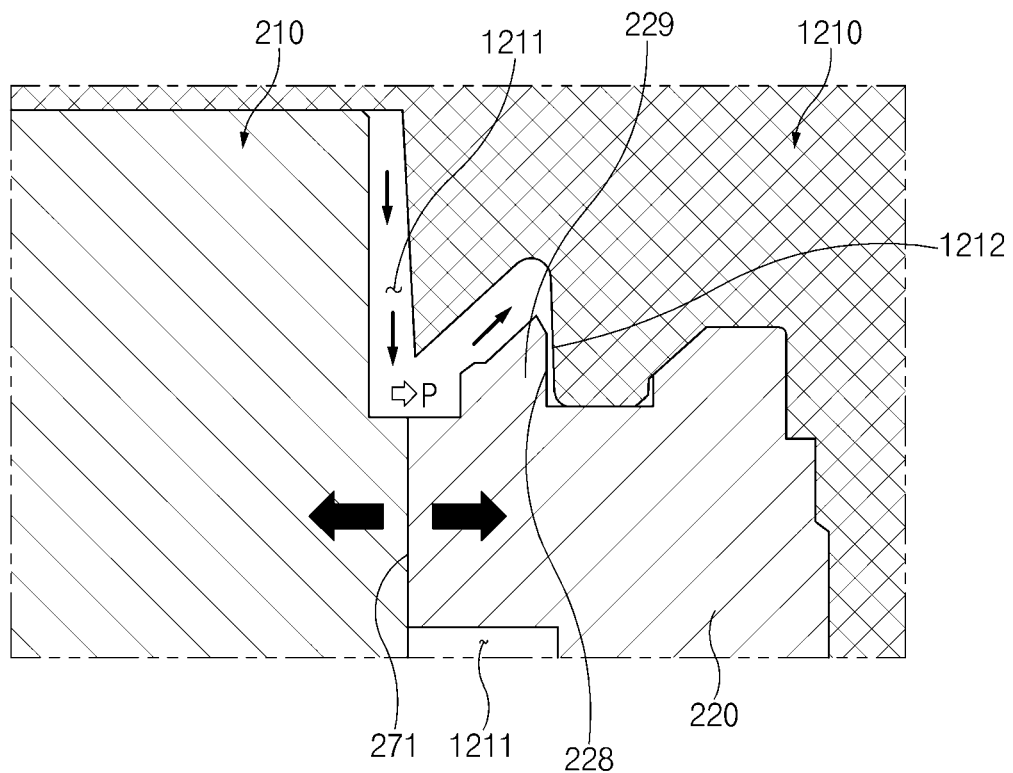
FIG. 12B illustrates a view related to a polymer part forming operation of FIG. 10 according to an embodiment of this disclosure.

FIG. 12A is a view related to the operation of bonding the inner metal part and the outer metal part in the method for manufacturing the side member of the electronic device according to FIG. 10. FIG. 12B is a view related to the operation of forming the polymer part in the method for manufacturing the side member of the electronic device according to FIG. 10. FIG. 12B is a sectional view taken along line D-D' illustrated in FIG. 12A.

Referring to FIG. 12A, the second metal part 220 may include a bridge 1122 making contact with the first metal part 210. A plurality of bridges 1122 may be formed. The bridges 1122 may be removed in the operation (e.g., the operation 1060 of FIG. 10) of machining the side member and may tentatively fix the second metal part 220 to the first metal part 210 before the operation (e.g., the operation 1050 of FIG. 10) of forming the polymer part.

In an embodiment, the operation (e.g., the operation 1050 of FIG. 10) of forming the polymer part (e.g., the polymer part 230 of FIGS. 7A and 7B) may be performed by injecting the polymer material into the first metal part 210 and the second metal part 220. For example, the operation of forming the polymer part 230 may include an operation of filling the cavity 1211 of a mold 1210, in which the first metal part 210 and the second metal part 220 are located, with the polymer material.

Referring to FIG. 12B, the cavity 1211 surrounded by the first metal part 210 and the second metal part 220 may be formed in the mold 1210. The polymer material may be received in the cavity 1211. For example, arrows illustrated in FIG. 12B represent the path along which the polymer material is received in the cavity 1211. The injection process may be performed at high pressure P. For example, the first metal part 210 and the second metal part 220 may be separated from each other by the pressure P. For example, there may be a clearance between the first metal part 210 and the second metal part 220.

To prevent the clearance, the second metal part 220 may include a protruding portion 229. For example, the protruding portion 229 may include a support surface 228 parallel to the contact surfaces (e.g., the first coupling area 271) substantially formed by the first inner surface of the first metal part 210 and the second inner surface of the second metal part 220. For example, the mold 1210 may include a corresponding support surface 1212 that supports the support surface 228 of the protruding portion 229. The corresponding support surface 1212 may be substantially parallel to the contact surfaces (e.g., the first coupling area 271). Accordingly, in the injection process, the support surface 228 of the second metal part 220 may be supported by the corresponding support surface 1212 of the mold 1210, and thus the first metal part 210 and the second metal part 220 may be prevented from being separated from each other.

An electronic device 100 according to embodiments of the disclosure may include a front plate 120, a back plate (similar to the second cover 180) that faces away from the front plate 120, a display 130 that is disposed between the front plate 120 and the back plate 180 (also referred to as the second cover) and that is visible through the front plate 120, a frame structure 201 that surrounds an interior space between the front plate 120 and the back plate 180 and that is formed of a metallic material, the frame structure 201 including a first metal part 210 containing a first metallic material and a second metal part 220 containing a second metallic material, a polymer part 230 that is coupled to the frame structure 201 and that contains a polymer material, and an adhesive layer 260 that bonds the polymer part 230 and the frame 201. The frame structure 201 may have an opening 250 formed in a first part thereof, the opening 250 being formed through the first metal part 210 and being formed to a specified depth through the second metal part 220, and the polymer part 230 may form at least part of an inner surface of the opening 250.

In various embodiments, when viewed in a direction in which the opening 250 is formed through the first metal part 210 and the second metal part 220, a first metal area 210a formed by the first metal part 210, a polymer area 230a formed by the polymer part 230, and a second metal area 220a formed by the second metal part 220 may be sequentially formed on the inner surface of the opening 250.

In various embodiments, the adhesive layer 260 may include an organic adhesive layer containing an organic material.

In various embodiments, the adhesive layer 260 may include a first adhesive layer 261 coupled with the first metal part 210 and a second adhesive layer 262 coupled with the second metal part 220, the first adhesive layer 261 may contain the first metallic material, the polymer material, and the organic material, and the second adhesive layer 262 may contain the second metallic material, the polymer material, and the organic material.

In various embodiments, the opening 250 may extend along a lengthwise direction of the frame structure 201. When viewed in an extension direction of the opening 250, the polymer part 230 may include a first portion 232-1 adjacent to a first end portion of the opening 250 in the extension direction and a second portion 232-2 adjacent to a second end portion of the opening 250 in the extension direction. Each of the first portion 232-1 and the second portion 232-2 may form a portion of the inner surface of the opening 250.

In various embodiments, the polymer part 230 may further include a third portion 232-3 extending from the first portion 232-1 to the second portion 232-2 along the inner surface of the opening 250.

In various embodiments, the opening 250 may be formed through at least part of the polymer part 230.

In various embodiments, the electronic device 100 may further include a key input devices 117 (such as a side button structure) related to a function of the electronic device 100, and at least part of the key input devices 117 may be accommodated in the opening 250.

In various embodiments, the polymer member may further include a third portion that faces the front plate or the back plate.

In various embodiments, the frame structure 201 may include a first surface that faces one of the front plate 120 or the back plate 180 and a second surface that faces the other one of the front plate 120 or the back plate 180, and the polymer part 230 may extend from one of the first surface or the second surface toward the other.

In various embodiments, at least part of the polymer part 230 may be accommodated in a recess 240 formed on the first surface or the second surface, and the opening 250 may be formed through the frame structure 201 so as to be connected with the recess 240.

In various embodiments, a second part of the frame structure 201 may include a first contact surface included in the first metal part 210 and directly coupled with the second metal part 220 and a second contact surface that is included in the second metal part 220 and that makes contact with the first contact surface, and a bumpy structure including recesses in a repeated or irregular pattern may be formed on each of the first contact surface and the second contact surface.

An electronic device 100 according to embodiments of the disclosure may include a housing 110 including a front plate such as the first plate 120, a back plate 180 that faces away from the front plate such as the first plate 120, and a side member 200 that surrounds an interior space between the front plate such as the first plate 120 and the back plate 180. A first part of the side member 200 may include a first metal part 210 that forms a surface of the electronic device and that contains a first metallic material, a second metal part 220 that is coupled to the first metal part 210 so as to extend in a direction from the first metal part 210 toward the interior space and that contains a second metallic material, a polymer part 230 that is coupled to the first metal part 210 and the second metal part 220 and that contains a polymer material, and a first adhesive layer 261 that bonds the polymer part 230 and the first metal part 210. A recess 240 may be concavely formed on the first metal part 210 and the second metal part 220 in a direction toward the front plate such as the first plate 120 or the back plate 180, and the polymer part 230 may include a first portion 231 that forms an outer surface of the side member 200 and that is formed on an area around the recess 240 and a second portion 232 that extends from the first portion 231 into the recess 240.

In various embodiments, the first adhesive layer 261 may extend from the area around the recess 240 to an inner surface of the recess 240.

In various embodiments, the electronic device 100 may further include a second adhesive layer 262 that bonds the polymer part 230 and the second metal part 220. The first adhesive layer 261 may contain the first metallic material, the polymer material, and an organic material, and the second adhesive layer 262 may contain the second metallic material, the polymer material, and an organic material.

In various embodiments, the side member 200 may have an opening 250 formed through the first part thereof in a direction from outside the housing 110 toward the interior space, and the opening 250 may be formed through at least part of the second portion 232 of the polymer part 230.

An electronic device 100 according to embodiments of the disclosure may include a front plate such as the first plate 120, a back plate 180 that faces away from the front plate such as the first plate 120, a display 130 that is disposed between the front plate such as the first plate 120 and the back plate 180 and that is visible through the front plate 120, a frame structure 201 that surrounds an interior space between the front plate such as the first plate 120 and the back plate 180, the frame structure 201 including a first metal part 210 containing a first metallic material and a second metal part 220 containing a second metallic material, a polymer part 230 that is coupled to the frame structure 201 and that contains a polymer material, and an opening formed through the frame structure 201 to connect the outside of the electronic device 100 and the interior space, and an inner surface of the opening may be formed by the first metal part.

In various embodiments, the frame structure 201 may include a first part having the opening 250 formed therein and a second part extending from the first part, the first part may be formed by the first metal part 210, and the second part may be formed by the first metal part 210 and the second metal part 220.

In various embodiments, the electronic device 100 may further include a plate structure 202 that extends from the frame structure 201 to the interior space or is coupled to the frame structure 201 and that includes the second metal part 220. The polymer part 230 may be configured such that at least part thereof couples the frame structure 201 and the plate structure 202.

In various embodiments, the electronic device 100 may further include an adhesive layer 260 that bonds the polymer part 230 to each of the first metal part 210 and the second metal part 220, and the adhesive layer 260 may contain an organic material.

According to the embodiments of the disclosure, the coupling force between the first metal part and the second metal part included in the metal housing may be improved.

Furthermore, according to the embodiments of the disclosure, a defect that is likely to occur in a manufacturing process may be decreased by preventing a clearance between the first metal part and the second metal part.

In addition, the disclosure may provide various effects that are directly or indirectly recognized.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device). For example, a processor of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
 a front plate;
 a back plate configured to face away from the front plate;
 a display disposed between the front plate and the back plate, the display being visible through the front plate;
 a frame configured to surround an interior space between the front plate and the back plate and formed of a metallic material, the frame including a first metal part containing a first metallic material and a second metal part containing a second metallic material;
 a polymer member coupled to the frame, the polymer member containing a polymer material; and
 an adhesive layer configured to bond the polymer member and the frame,
 wherein the frame includes an opening formed in a first part thereof, the opening being formed through the first metal part and being formed to a specified depth through the second metal part, and
 wherein the polymer member forms at least part of an inner surface of the opening.

2. The electronic device of claim 1, wherein when viewed in a direction in which the opening is formed through the first metal part and the second metal part, a first metal area formed by the first metal part, a polymer area formed by the polymer member, and a second metal area formed by the second metal part are sequentially formed on the inner surface of the opening.

3. The electronic device of claim 1, wherein the adhesive layer includes an organic adhesive layer containing an organic material.

4. The electronic device of claim 3, wherein the adhesive layer includes a first adhesive layer coupled with the first metal part and a second adhesive layer coupled with the second metal part,
 wherein the first adhesive layer contains the first metallic material, the polymer material, and the organic material, and
 wherein the second adhesive layer contains the second metallic material, the polymer material, and the organic material.

5. The electronic device of claim 1, wherein the opening extends along a lengthwise direction of the frame,
 wherein when viewed in an extension direction of the opening, the polymer member includes a first portion adjacent to a first end portion of the opening in the extension direction and a second portion adjacent to a second end portion of the opening in the extension direction, and
 wherein each of the first portion and the second portion forms a portion of the inner surface of the opening.

6. The electronic device of claim 5, wherein the polymer member further includes a third portion extending from the first portion to the second portion along the inner surface of the opening.

7. The electronic device of claim 1, wherein the opening is formed through at least part of the polymer member.

8. The electronic device of claim 1, further comprising:
 a side button structure related to a function of the electronic device,
 wherein at least part of the side button structure is accommodated in the opening.

9. The electronic device of claim 5, wherein the polymer member further includes a third portion configured to face the front plate or the back plate.

10. The electronic device of claim 1, wherein the frame includes a first surface configured to face one of the front plate or the back plate and a second surface configured to face either the front plate or the back plate, and
 wherein the polymer member extends from one of the first surface towards to second surface or the second surface toward other first surface.

11. The electronic device of claim 10, wherein at least part of the polymer member is accommodated in a recess formed on the first surface or the second surface, and
 wherein the opening is formed through the frame so as to be connected with the recess.

12. The electronic device of claim 1, wherein a second part of the frame includes a first contact surface included in the first metal part and directly coupled with the second metal part and a second contact surface included in the second metal part and configured to make contact with the first contact surface, and
 wherein a bumpy structure including recesses in a repeated or irregular pattern is formed on each of the first contact surface and the second contact surface.

13. An electronic device comprising:
 a housing including a front plate, a back plate configured to face away from the front plate, and a side member configured to surround an interior space between the front plate and the back plate,
 wherein a first part of the side member includes:
  a first metal part configured to form a surface of the electronic device, the first metal part containing a first metallic material,
  a second metal part coupled to the first metal part so as to extend in a direction from the first metal part toward the interior space, the second metal part containing a second metallic material,
  a polymer part coupled to the first metal part and the second metal part, the polymer part containing a polymer material, and
  a first adhesive layer configured to bond the polymer part and the first metal part,
 wherein a recess is concavely formed on the first metal part and the second metal part in a direction toward the front plate or the back plate, and
 wherein the polymer part includes a first portion configured to form an outer surface of the side member and formed on an area around the recess and a second portion extending from the first portion into the recess.

14. The electronic device of claim 13, wherein the first adhesive layer extends from the area around the recess to an inner surface of the recess.

15. The electronic device of claim 13, further comprising:
 a second adhesive layer configured to bond the polymer part and the second metal part,
 wherein the first adhesive layer contains the first metallic material, the polymer material, and an organic material, and
 wherein the second adhesive layer contains the second metallic material, the polymer material, and an organic material.

16. The electronic device of claim 13, wherein the side member has an opening formed through the first part thereof in a direction from outside the housing toward the interior space, and
 wherein the opening is formed through at least part of the second portion of the polymer part.

* * * * *